(12) United States Patent
Kim

(10) Patent No.: US 12,294,040 B2
(45) Date of Patent: May 6, 2025

(54) DISPLAY DEVICE AND METHOD FOR MANUFACTURING THE DISPLAY DEVICE

(71) Applicant: Samsung Display Co., Ltd., Yongin-si (KR)

(72) Inventor: Byoung Yong Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 621 days.

(21) Appl. No.: 17/711,904

(22) Filed: Apr. 1, 2022

(65) Prior Publication Data

US 2022/0328727 A1    Oct. 13, 2022

(30) Foreign Application Priority Data

Apr. 7, 2021    (KR) .................. 10-2021-0044973

(51) Int. Cl.
  *H01L 33/38*    (2010.01)
  *H01L 33/00*    (2010.01)
  *H01L 33/24*    (2010.01)
  *H01L 33/62*    (2010.01)

(52) U.S. Cl.
  CPC .......... *H01L 33/382* (2013.01); *H01L 33/005* (2013.01); *H01L 33/24* (2013.01); *H01L 33/62* (2013.01)

(58) Field of Classification Search
  None
  See application file for complete search history.

(56) References Cited

U.S. PATENT DOCUMENTS

| 6,189,208 | B1* | 2/2001 | Estes | H01L 21/563 |
| | | | | 257/E21.503 |
| 9,466,765 | B1* | 10/2016 | Yoon | H01L 33/62 |
| 2017/0108173 | A1* | 4/2017 | Kim | H01L 33/0033 |
| 2018/0335583 | A1 | 11/2018 | Jou et al. | |
| 2018/0335586 | A1 | 11/2018 | Jou et al. | |

FOREIGN PATENT DOCUMENTS

JP    2011-009427 A    1/2011

* cited by examiner

*Primary Examiner* — William C Trapanese
(74) *Attorney, Agent, or Firm* — Womble Bond Dickinson (US) LLP

(57) ABSTRACT

A display device including: a lower substrate including a plurality of first protrusions; a base substrate on the lower substrate, wherein the base substrate includes a plurality of second protrusions overlapping with the plurality of first protrusions, respectively; and a plurality of pad electrodes on the base substrate, wherein each of the plurality of pad electrodes includes a plurality of third protrusions overlapping with the plurality of second protrusions, respectively.

20 Claims, 18 Drawing Sheets

DP: SUB, ATL, ENP, LSS

DP: SUB, ATL, ENP, LSS

DP: SUB, ATL, ENP, LSS

DISPLAY DEVICE AND METHOD FOR MANUFACTURING THE DISPLAY DEVICE

CROSS-REFERENCE TO RELATED APPLICATION

The present application claims priority to and the benefit of Korean Patent Application No. 10-2021-0044973 filed on Apr. 7, 2021 in the Korean Intellectual Property Office, the entire content of which is incorporated herein by reference.

BACKGROUND

1. Field

Aspects of some embodiments of the present disclosure relate to a display device and a method for manufacturing the display device.

2. Description of Related Art

The importance of display devices is increasing with the development of multimedia. In response to this trend, various types of display devices such as a liquid crystal display device (LCD), an organic light-emissive display device (OLED), and a quantum-dot light emitting display device (QLED) have been used.

A display device generally includes a display panel on which light emission elements are arranged, a driver member for driving the light emission elements, and a printed circuit film attached to the display panel. The display panel, the driver member and the printed circuit film may be electrically connected to each other via bonding using an adhesive member. In a design of the display device as described above, it may be useful to prevent or reduce instances of a connection fault of the driver member or the printed circuit board.

The above information disclosed in this Background section is only for enhancement of understanding of the background and therefore the information discussed in this Background section does not necessarily constitute prior art.

SUMMARY

Aspects of some embodiments of the present disclosure include a display device that may prevent a connection fault between a display panel and a printed circuit board or a driver member.

Aspects of some embodiments of the present disclosure include a method for manufacturing the display device.

Characteristics of embodiments according to the present disclosure are not limited to the above-mentioned characteristics. Other aspects and characteristics of embodiments according to the present disclosure that are not mentioned may be understood based on following descriptions, and may be more clearly understood based on embodiments according to the present disclosure. Further, it will be easily understood that the characteristics of embodiments according to the present disclosure may be realized using means shown in the claims and combinations thereof.

According to some embodiments, a display device includes a lower substrate including a plurality of first protrusions; a base substrate on the lower substrate, wherein the base substrate includes a plurality of second protrusions overlapping with the plurality of first protrusions, respectively; and a plurality of pad electrodes on the base substrate, wherein each of the plurality of pad electrodes includes a plurality of third protrusions overlapping with the plurality of second protrusions, respectively.

According to some embodiments, a display device includes a base substrate; an active element layer on one face of the base substrate; a plurality of pad electrodes on one face of the base substrate; a polymer film layer on an opposite face to one face of the base substrate, wherein the polymer film layer overlaps the active element layer in a thickness direction of the device; and a lower substrate on the opposite face of the base substrate, wherein the lower substrate overlaps with the plurality of pad electrodes in the thickness direction of the device, wherein each of the lower substrate, the base substrate, and each of the plurality of pad electrodes includes a plurality of protrusions.

According to some embodiments, a method for manufacturing a display device, the method comprises forming a plurality of first protrusions on a lower substrate; and compressing the lower substrate against a base substrate to form a plurality of second protrusions in a pad area of the base substrate.

Further details of some embodiments are included in detailed descriptions and drawings.

The display device and the method for manufacturing the display device according to some embodiments may prevent or reduce instances of a connection fault between the display panel and the printed circuit board or the driver member.

Characteristics of some embodiments of the present disclosure are not limited to the above-mentioned characteristics, and other characteristics as not mentioned will be clearly understood by those skilled in the art from following descriptions.

BRIEF DESCRIPTION OF DRAWINGS

The above and other aspects and features of embodiments according to the present disclosure will become more apparent by describing in more detail aspects of some embodiments thereof with reference to the attached drawings, in which.

DETAILED DESCRIPTIONS

Figure 1:
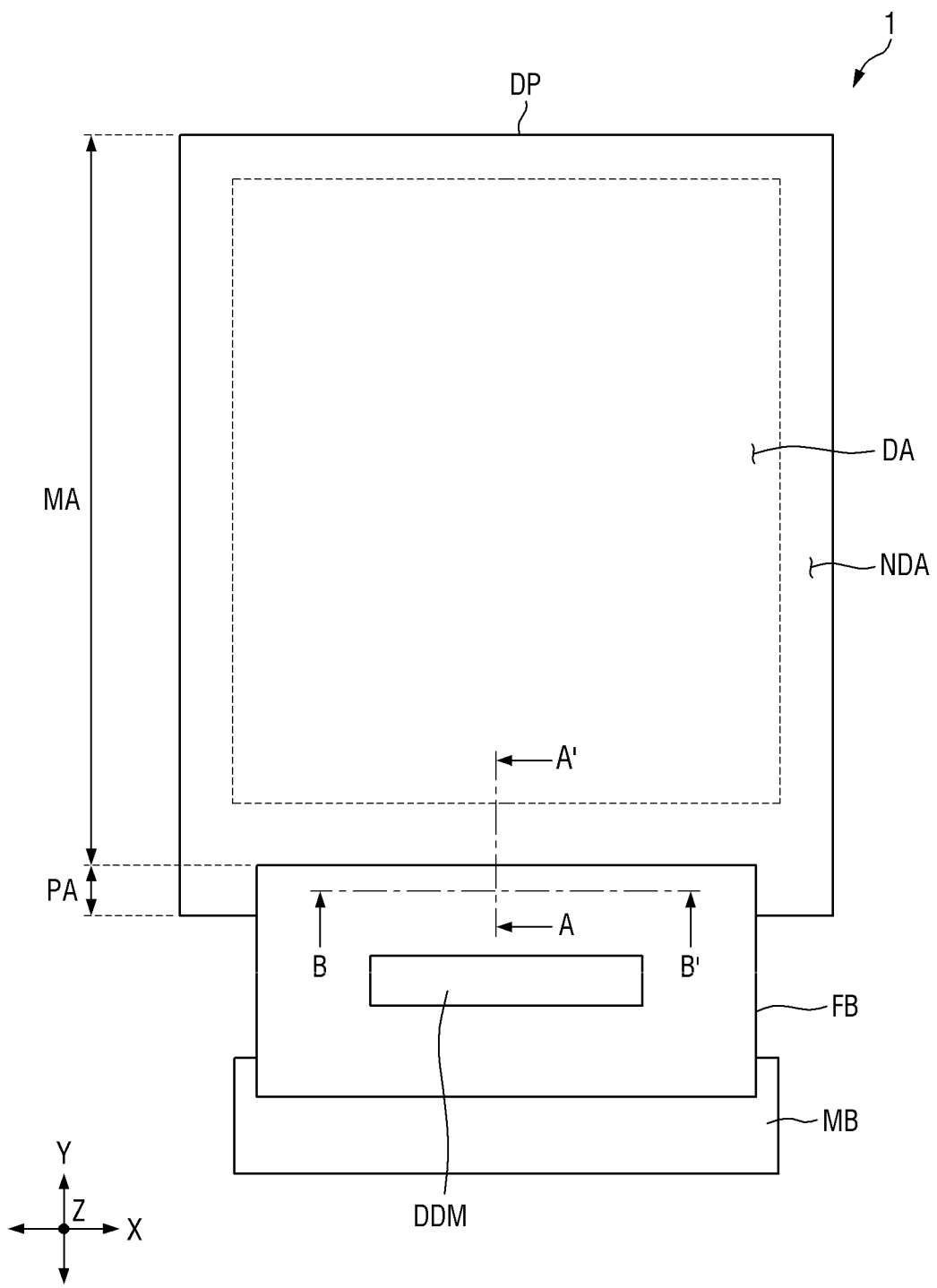
FIG. 1 is a plan view of a display device according to some embodiments.

Aspects and features of some embodiments of the present disclosure, and a method of achieving the characteristics and features will become more apparent with reference to embodiments described in more detail later together with the accompanying drawings. However, embodiments according to the present disclosure are not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and embodiments according to the present disclosure are not limited thereto. The same reference numerals refer to the same elements herein. Further, some descriptions and details of well-known steps and elements may be omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be arranged or located directly on the second element or may be arranged or located indirectly on the second element with a third element or layer being arranged or located between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is located "on" or "on a top" of another layer, film, region, plate, or the like, the former may directly contact the latter or still another layer, film, region, plate, or the like may be located between the former and the latter. As used herein, when a layer, film, region, plate, or the like is directly located "on" or "on a top" of another layer, film, region, plate, or the like, the former directly contacts the latter and still another layer, film, region, plate, or the like is not located between the former and the latter. Further, as used herein, when a layer, film, region, plate, or the like is located "below" or "under" another layer, film, region, plate, or the like, the former may directly contact the latter or still another layer, film, region, plate, or the like may be located between the former and the latter. As used herein, when a layer, film, region, plate, or the like is directly located "below" or "under" another layer, film, region, plate, or the like, the former directly contacts the latter and still another layer, film, region, plate, or the like is not located between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, specific implementations of embodiments according to the present disclosure will be described in more detail with reference to the accompanying drawings.

Figure 2:
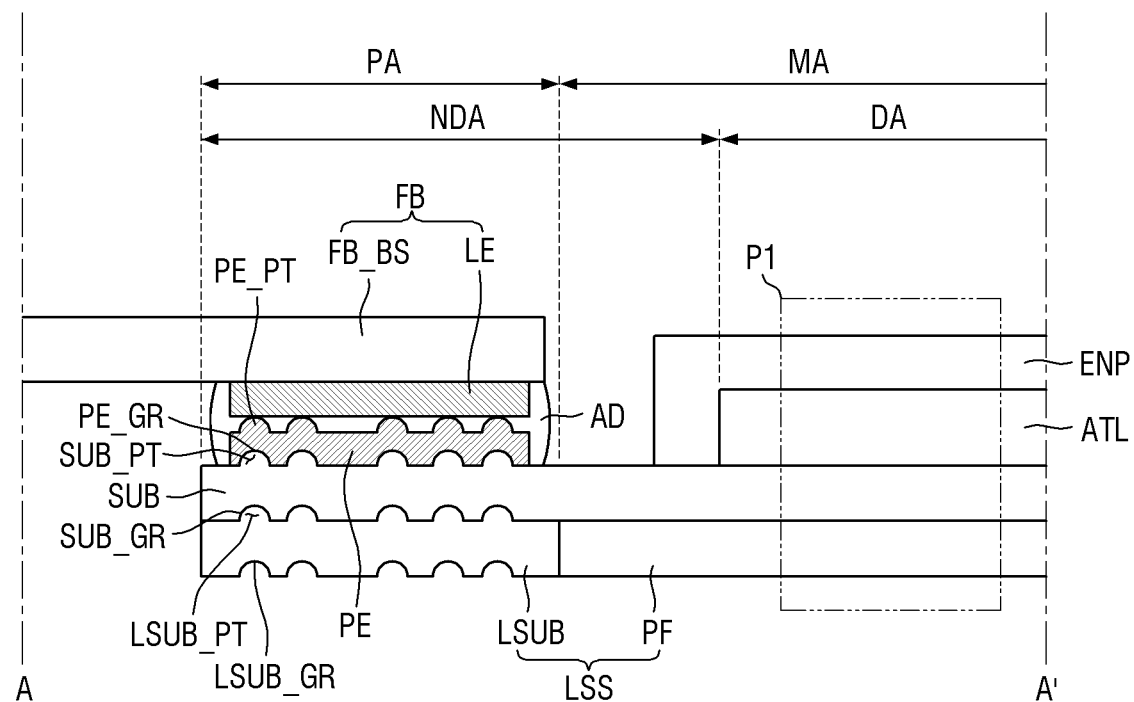
FIG. 2 is a cross-sectional view taken along a line A-A' in FIG. 1.
Figure 2:
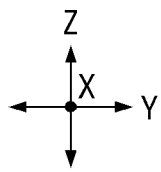

FIG. 1 is a plan view of a display device according to an implementation. FIG. 2 is a cross-sectional view taken along the line A-A' in FIG. 1.

Hereinafter, a first direction X, a second direction Y and a third direction Z are different directions and intersect each other. In one example, the first direction X may refer to a length direction, the second direction Y may refer to a width direction, and the third direction Z may refer to a height direction or a thickness direction. Each of the first direction X, the second direction Y, and the third direction Z may include two directions. In one example, the third direction Z may include an upward direction toward a top on the drawing and a downward direction toward a bottom on the drawing. The upward direction and the downward direction may be referred to as a frontward direction in which an image is displayed and a rearward direction opposite thereto. However, the directions and the name thereof should be construed in a relative manner. Embodiments according to the present disclosure are not limited to the example.

Referring to FIG. 1, a display device 1 displays moving images (e.g., video images) or still (e.g., static) images. The display device 1 may be used as a display screen of each of portable electronic devices such as a mobile phone, a smart phone, a tablet PC (personal computer), a smart watch, a watch phone, a mobile communication terminal, and an electronic notebook, a E-book, a PMP (Portable Multimedia Player), a navigation, an UMPC (Ultra Mobile) PC, etc. and various electronic products such as televisions, laptops, monitors, billboards, and IoT devices.

The display device 1 may include a display panel DP, a connection circuit board FB, and a main circuit board MB.

The display panel DP, the connection circuit board FB and the main circuit board MB may be electrically connected to each other.

The display panel DP may include a light emitting element. For example, the display panel DP may include an organic light-emissive display panel using an organic light-emissive diode including an organic light-emissive layer, a micro light-emissive diode display panel using a micro LED, a quantum dot light-emissive display panel using a quantum dot light emitting diode, or an inorganic light-emissive display panel using an inorganic light emission element including an inorganic semiconductor. According to some embodiments, the display panel DP may be implemented as the organic light-emissive display panel. However, embodiments according to the present disclosure are not limited thereto.

The display panel DP may have, for example, an approximate rectangular shape with both short-sides extending in the first direction X and both long-sides extending in the second direction Y in a plan view. However, embodiments according to the present disclosure are not limited thereto.

The display device 1 may include a display area DA and a non-display area NDA.

The display area DA may display images. A plurality of pixels for displaying images may be located in the display area DA. A sensor for sensing a touch input, a fingerprint pattern, or a pen input may be located in the display area DA. The display area DA may have, for example, a roughly rectangular shape in a plan view. However, embodiments according to the present disclosure are not limited thereto.

The non-display area NDA may not display images. For example, the non-display area NDA may be a bezel area outside a footprint of (or in a periphery of) the display area DA). The non-display area NDA may not detect a user's touch input, a fingerprint pattern, or a pen input. The non-display area NDA may be arranged around the display area DA. The non-display area NDA may be arranged to surround at least a portion of the display area DA in a plan view (e.g., in a direction normal or perpendicular with respect to a display surface (e.g., a plane parallel to a plane defined by the first direction X and the second direction Y)). According to some embodiments, the non-display area NDA may have a band shape (or a continuous shape) surrounding the display area DA in a plan view. However, embodiments according to the present disclosure are not limited thereto.

The non-display area NDA may refer to the remaining area of the display device 1 excluding the display area DA. One portion of the non-display area NDA may be located in a main area MA which will be described later, while the other portion of the non-display area NDA may be located in a pad area PA which will be described in more detail later.

The display panel DP may include the main area MA and the pad area PA.

The main area MA may occupy most of the display panel DP. The main area MA may have a roughly rectangular shape in a plan view. However, embodiments according to the present disclosure are not limited thereto.

The pad area PA may be arranged around the main area MA. The pad area PA may be connected to the main area MA. The pad area PA may extend from the main area MA. According to some embodiments, the pad area PA may be arranged along a short-side in the first direction X of the main area MA located at a bottom of FIG. 1. However, a position of the pad area PA is not limited thereto.

The pad area PA may act as an area to which the connection circuit board FB is connected. At least a portion of the pad area PA may overlap with the connection circuit board FB in the third direction Z.

The connection circuit board FB may connect the display panel DP and the main circuit board MB to each other. One side of the connection circuit board FB may be attached to the pad area PA of the display panel DP, while the opposite side of the connection circuit board FB may be attached to the main circuit board MB.

The connection circuit board FB may be flexible and may be bent. In one example, the connection circuit board FB may be embodied as a flexible circuit film. However, embodiments according to the present disclosure are not limited thereto.

The display device 1 may further include a driver member (or driver or driving component) DDM mounted on the connection circuit board FB.

The driver member DDM may process an electrical signal output from the display panel DP and provide the processed signal to the main circuit board MB. The driver member DDM may include at least one integrated circuit, for example, a display driver integrated circuit. That is, the driver member DDM may act as a display driver member that provides an electrical signal for driving a plurality of pixels to the display panel DP. However, embodiments according to the present disclosure are not limited thereto. The driver member DDM may be embodied as a touch driver member including a touch driver integrated circuit for recognizing a user's touch input, a fingerprint pattern, and a pen input.

According to some embodiments, the driver member DDM may be mounted on the connection circuit board FB in a COF (Chip on Film) scheme. However, embodiments according to the present disclosure are not limited thereto. The driver member DDM may be mounted thereon in various schemes such as a COP (Chip on Plastic) scheme and a COG (Chip on Glass) scheme.

The main circuit board MB may be connected to the connection circuit board FB. The main circuit board MB may be electrically connected to the display panel DP via the connection circuit board FB. The main circuit board MB may provide image data, a control signal, a power voltage, etc. to the display panel DP or the driver member DDM.

Referring further to FIG. 2, the display panel DP may include a base substrate SUB, an active element layer ATL, and an encapsulation layer ENP.

The base substrate SUB may be arranged across the main area MA and the pad area PA. That is, the base substrate SUB may extend across both the main area MA and the pad area PA, and similarly across the display area DA and the non-display area NDA. The base substrate SUB may be implemented as a flexible substrate including a plastic polymer material such as polyimide. Accordingly, the display panel DP may be flexible, bent, folded, or rolled. According to some embodiments, the base substrate SUB may include a plastic polymer film mainly composed of polyimide. However, embodiments according to the present disclosure are not limited thereto. According to some embodiments, the base substrate SUB may be embodied as a rigid substrate including a rigid material such as glass or quartz.

The main area MA and the pad area PA may be defined based on the base substrate SUB. The main area MA may refer to one area of the base substrate SUB in which the active element layer ATL is formed to display images. The pad area PA may refer to the opposite area of the base substrate SUB on which a plurality of pad electrodes PEs which will be described later are located in an attached manner.

The active element layer ATL may be located on one face of the base substrate SUB, for example, on a top face of the base substrate SUB in FIG. 2. The active element layer ATL may be located in the display area DA. The active element layer ATL may include a light emission element and a thin-film transistor ("ST" in FIG. 3) driving the element. The display area DA may be defined by the active element layer ATL. However, embodiments according to the present disclosure are not limited thereto.

The encapsulation layer ENP may be arranged on the active element layer ATL. The encapsulation layer ENP may protect the active element layer ATL while covering the active element layer ATL. The encapsulation layer ENP may include at least one inorganic film and at least one organic film. The encapsulation layer ENP may be replaced with a member identical or similar to the base substrate SUB.

The connection circuit board FB may include a base member FB_BS and at least one lead electrode LE.

The base member FB_BS has flexibility and may be bent. A portion of the base member FB_BS may overlap with the pad area PA in the third direction Z.

The lead electrode LE may be arranged on one face of the base member FB_BS facing toward the base substrate SUB, for example, on a bottom face of the base member FB_BS in FIG. 2 so as to face toward the pad electrode PE. The lead electrode LE may overlap with the pad electrode PE in the third direction Z. The lead electrode LE may be electrically connected to the driver member DDM. The display device 1 may further include an adhesive member AD interposed between the pad area PA and the connection circuit board FB.

The adhesive member AD may attach the connection circuit board FB to the pad area PA. The adhesive member AD may include an insulating adhesive material. According to some embodiments, the insulating adhesive material may include a thermoplastic material such as styrene butadiene and polyvinyl butene. According to some embodiments, the insulating adhesive material may include a thermosetting material such as epoxy resin, polyurethane, acrylic resin, and the like.

The adhesive member AD may be composed of only an insulating adhesive material. The adhesive member AD may not contain an electrically-conductive material, for example, electrically-conductive particles such as conductive balls. In one implementation, the adhesive member AD may be embodied as a non-electrically-conductive film, or a non-electrically-conductive adhesive. However, embodiments according to the present disclosure are not limited thereto.

The display panel DP may include at least one pad electrode PE arranged in the pad area PA.

The pad electrode PE may be arranged to overlap the lead electrode LE of the connection circuit board FB in the pad area PA in the third direction Z.

Each of the pad electrode PE and the lead electrode LE may contain an electrically-conductive metal. In one example, each of the pad electrode PE and the lead electrode LE may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). However, embodiments according to the present disclosure are not limited thereto. Each of the pad electrode PE and the lead electrode LE may be composed of a single layer, or a plurality of layers.

The display device 1 may include a lower stack structure LSS located on the opposite face of the base substrate SUB, for example, a bottom face of the base substrate SUB in FIG. 2.

The lower stack structure LSS may include a polymer film layer PF located in the main area MA and a lower substrate LSUB located in the pad area PA.

The polymer film layer PF may be located on a portion of a bottom face of the base substrate SUB that is located in the main area MA. The polymer film layer PF may be arranged to cover a portion of a bottom face of the base substrate SUB located in the main area MA. The polymer film layer PF may be attached on a bottom face of the base substrate SUB via a bonding member such as a pressure sensitive adhesive. The polymer film layer PF may be primarily located in the display area DA, while a portion thereof may be located in the non-display area NDA. The polymer film layer PF may overlap with the active element layer ATL and the encapsulation layer ENP in the third direction Z.

The polymer film layer PF may include a polymer film. The polymer film layer PF may include, for example, polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), a cycloolefin polymer (COP), etc. The polymer film layer PF may include a functional layer on at least one face thereof. The functional layer may include, for example, a light absorbing layer. The light absorbing layer may contain therein a light absorbent material such as black pigment or dye. The light absorbing layer may be formed on the polymer film by coating or printing a black ink thereon.

The lower substrate LSUB may be located on a portion of a bottom face of the base substrate SUB located in the pad area PA. The lower substrate LSUB may be arranged to cover the other portion of a bottom face of the base substrate SUB arranged in the main area MA. The lower substrate LSUB may be attached onto a bottom face of the base substrate SUB. According to some embodiments, the lower substrate LSUB may be attached onto a bottom face of the base substrate SUB via a bonding member such as a pressure sensitive adhesive. According to some embodiments, the lower substrate LSUB may be fixed onto a bottom face of the base substrate SUB via a separate member such as an outer molding surrounding an edge portion of each of the lower substrate LSUB and the pad area PA. The lower substrate LSUB may be located in the non-display area NDA. The lower substrate LSUB may overlap with the pad electrode PE, the lead electrode LE and the connection circuit board FB in the third direction Z.

A bottom face of the base substrate SUB may be covered with the polymer film layer PF and the lower substrate LSUB. The polymer film layer PF may be arranged in a partial area of a bottom face of the base substrate SUB located in the main area MA, while the lower substrate LSUB may be located in the other area of a bottom face of the base substrate SUB located in the pad area PA. The polymer film layer PF may support a portion of the base substrate SUB located in the main area MA, while the lower substrate LSUB may support the other portion of the base substrate SUB located in the pad area PA.

Each of the lower substrate LSUB, the base substrate SUB, and the pad electrode PE may include a plurality of protrusions LSUB_PT, SUB_PT, and PE_PT and a plurality of grooves LSUB_GR, SUB_GR, and PE_GR.

The plurality of protrusions LSUB_PT, SUB_PT, and PE_PT and the plurality of grooves LSUB_GR, SUB_GR, and PE_GR may be located in the non-display area NDA. The plurality of protrusions LSUB_PT, SUB_PT, and PE_PT and the plurality of grooves LSUB_GR, SUB_GR, and PE_GR may be located in the pad area PA.

Hereinafter, for convenience of description, the protrusion LSUB_PT and the groove LSUB_GR of the lower substrate LSUB may be referred to as a first protrusion LSUB_PT and a first groove LSUB_GR, respectively. The protrusion SUB_PT and the groove SUB_GR of the base substrate SUB may be referred to as a second protrusion SUB_PT and a second groove SUB_GR, respectively. The protrusion PE_PT and the groove PE_GR of the pad electrode PE may be referred to as a third protrusion PE_PT and a third groove PE_GR, respectively.

The lower substrate LSUB may include a plurality of first protrusions LSUB_PT and a plurality of first grooves LSUB_GR.

The plurality of first protrusions LSUB_PT may be located on a top face of a lower substrate LSUB opposite to a bottom face of a base substrate SUB. The plurality of first protrusions LSUB_PT may protrude from the top face of the lower substrate LSUB toward the base substrate SUB. The plurality of first protrusions LSUB_PT may be accommodated in the plurality of second grooves SUB_GR which will be described later, respectively.

The plurality of first grooves LSUB_GR may be defined in a bottom face of the lower substrate LSUB. The plurality of first grooves LSUB_GR may overlap with the plurality of first protrusions LSUB_PT in the third direction Z, respectively. The plurality of first grooves LSUB_GR may be recessed toward the plurality of first protrusions LSUB_PT, respectively.

The base substrate SUB may include a plurality of second protrusions SUB_PT and a plurality of second grooves SUB_GR.

The plurality of second protrusions SUB_PT may be located on a top face of the base substrate SUB facing toward the connection circuit board FB and the lead electrode LE. The plurality of second protrusions SUB_PT may protrude from the top face of the base substrate SUB toward the connection circuit board FB and may be accommodated in a plurality of third grooves PE_GR, respectively.

The plurality of second grooves SUB_GR may be defined in a bottom face of the base substrate SUB facing toward the lower substrate LSUB. The plurality of second grooves SUB_GR may overlap with the plurality of second protrusions SUB_PT in the third direction Z, respectively. The plurality of second groove SUB_GR may be recessed toward the plurality of second protrusions SUB_PT, respectively.

The pad electrode PE may include a plurality of the third protrusions PE_PT and the plurality of the third grooves PE_GR.

A plurality of the third protrusions PE_PT may be located on a top face of the pad electrode PE facing toward the lead electrode LE. The plurality of the third protrusions PE_PT may protrude from the top face of the pad electrode PE toward the lead electrode LE. The plurality of the third protrusions PE_PT may directly contact the lead electrode LE. The adhesive member AD may be filled between the plurality of the third protrusions PE_PT.

The plurality of the third grooves PE_GR may be defined in a bottom face of the pad electrode PE facing toward the base substrate SUB. The plurality of the third grooves PE_GR may overlap with the plurality of the third protrusions PE_PT in the third direction Z, respectively. The plurality of the third grooves PE_GR may be recessed toward the plurality of the third protrusions PE_PT, respectively.

The first groove LSUB_GR, the first protrusion LSUB_PT, the second groove SUB_GR, the second protrusion SUB_PT, the third groove PE_GR, and the third protrusion PE_PT may overlap each other in the third direction Z. The first groove LSUB_GR, the first protrusion LSUB_PT, the second groove SUB_GR, the second protrusion SUB_PT, the third groove PE_GR, and the third protrusion PE_PT may be aligned with each other in the third direction Z.

As described in more detail below, the plurality of first protrusions LSUB_PT and the plurality of first grooves LSUB_GR may be indentations formed when a mold (MD FIG. 16) presses the lower substrate LSUB. The plurality of second grooves SUB_GR, the plurality of second protrusions SUB_PT, the plurality of the third grooves PE_GR and the plurality of the third protrusions PE_PT may be indentations formed when the plurality of first protrusions LSUB_PT press the base substrate SUB and the pad electrode PE.

The lower substrate LSUB may have a hardness higher than a hardness of a structure stacked on a top face of the lower substrate LSUB, for example, a hardness of each of the base substrate SUB and the pad electrode PE. The lower substrate LSUB may be made of a material different from that of the polymer film layer PF. According to some embodiments, the lower substrate LSUB may be implemented as a plate-shaped member made of a metal. The metal may include aluminum. However, embodiments according to the present disclosure are not limited thereto.

According to some embodiments, the first groove LSUB_GR, the first protrusion LSUB_PT, the second groove SUB_GR, the second protrusion SUB_PT, the third groove PE_GR and the third protrusion PE_PT may have substantially the same or similar size. However, embodiments according to the present disclosure are not limited thereto. Each of the first groove LSUB_GR, the first protrusion LSUB_PT, the second groove SUB_GR, the second protrusion SUB_PT, the third groove PE_GR, and the third protrusion PE_PT may be gradually reduced in size as each is closer to the connection circuit board FB.

Figure 3:
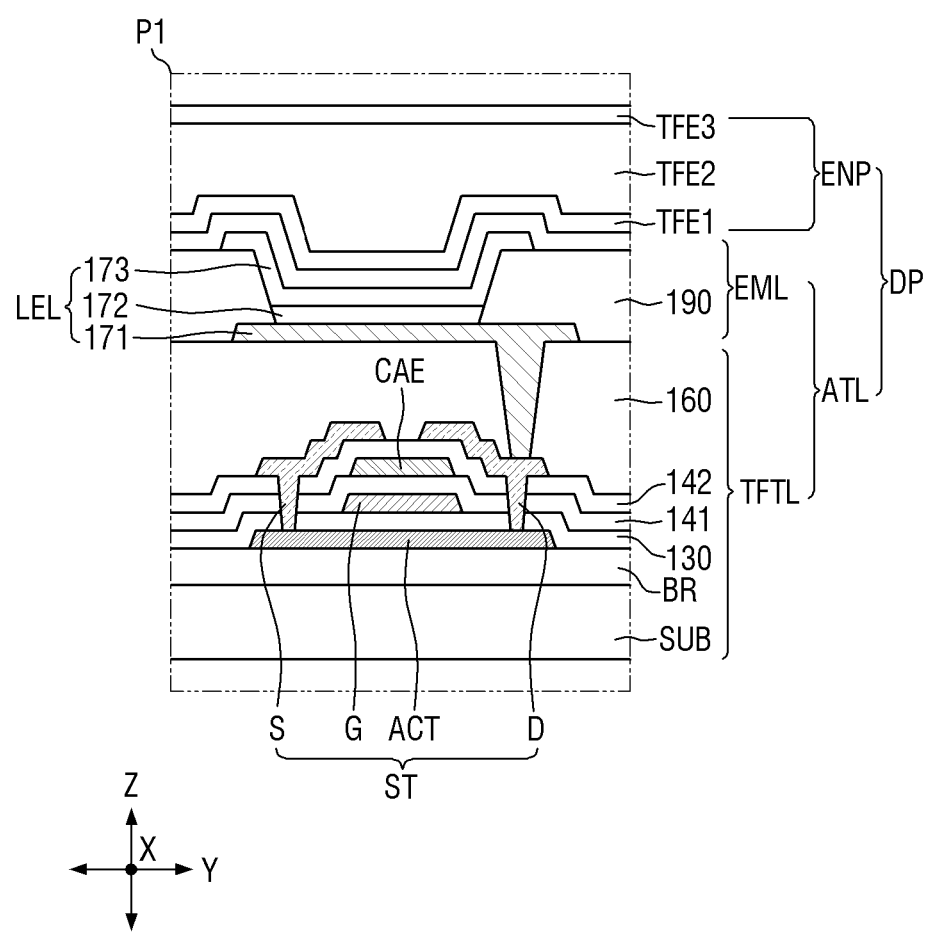
FIG. 3 is an enlarged cross-sectional view of a 'P1' portion of FIG. 2.

FIG. 3 is an enlarged cross-sectional view of a 'P1' portion of FIG. 2.

Referring to FIGS. 2 and 3, the active element layer ATL may include a thin-film transistor layer TFTL and a light emission element layer EML.

The thin-film transistor layer TFTL may include a barrier film BR, an active layer ACT, a gate insulating film 130, a gate electrode G, a first interlayer insulating film 141, a capacitor electrode CAE, a second interlayer insulating film 142, a source electrode S, a drain electrode D, and a planarization film 160.

The barrier film BR may be located on a top face of the base substrate SUB. The barrier film BR may prevent or reduce instances of moisture invasion through the base substrate SUB which is vulnerable to the moisture invasion. The barrier film BR may be formed of a structure in which a plurality of inorganic films are alternately stacked. For example, the barrier film BR may be composed of a multi-layer in which at least one inorganic film selected from a silicon nitride layer, a silicon oxynitride layer, a silicon oxide layer, a titanium oxide layer, and an aluminum oxide layer are alternately stacked. However, embodiments according to the present disclosure are not limited thereto.

The active layer ACT may be located on the barrier film BR. The active layer ACT may constitute a channel of the thin-film transistor ST. The active layer ACT may be formed in each pixel of the display area DA. In some cases, the active layer ACT may also be located in the non-display area NDA. According to some embodiments, the active layer ACT may include polycrystalline silicon, monocrystalline silicon, low temperature polycrystalline silicon, amorphous silicon, or oxide semiconductor. However, embodiments according to the present disclosure are not limited thereto.

The gate insulating film 130 may be located on the active layer ACT. The gate insulating film 130 may be formed across an entire base substrate SUB. The gate insulating film 130 may include a silicon compound, a metal oxide, or the like. In one example, the gate insulating film 130 may include silicon oxide, silicon nitride, silicon oxynitride, aluminum oxide, tantalum oxide, hafnium oxide, zirconium oxide, titanium oxide, and the like. These materials may be used alone or in combination with each other. However, embodiments according to the present disclosure are not limited thereto.

The gate electrode G may be located on the gate insulating film 130. The gate electrode G may overlap with the active layer ACT in the third direction Z. In one example, the gate electrode G may be formed as a single layer or a multi-layer made of one of molybdenum (Mo), aluminum (Al), chromium (Cr), gold (Au), titanium (Ti), nickel (Ni), neodymium (Nd), and copper (Cu), or an alloy thereof. However, embodiments according to the present disclosure are not limited thereto.

Figure 5:
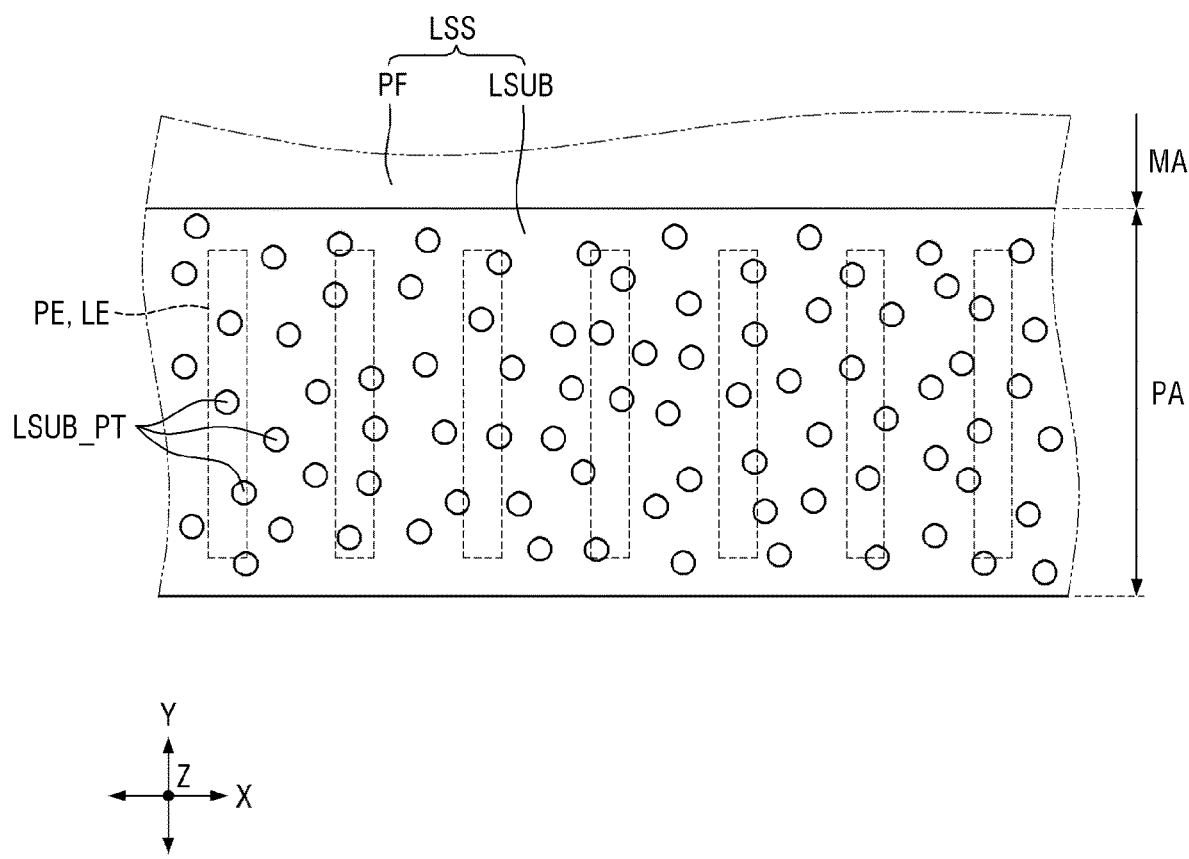
FIG. 5 is a plan view of a lower substrate according to some embodiments.

The first interlayer insulating film 141 may be located on the gate electrode G. The first interlayer insulating film 141 may be composed of an inorganic film, for example, a silicon nitride layer, a silicon oxynitride layer, a silicon oxide layer, a titanium oxide layer, or an aluminum oxide layer. However, embodiments according to the present disclosure are not limited thereto. In FIG. 5, the first interlayer insulating film 141 is shown as a single layer. However, the first interlayer insulating film 141 may be composed of a plurality of inorganic films.

The capacitor electrode CAE may be located on the first interlayer insulating film 141. The capacitor electrode CAE may overlap a gate electrode G of the first thin-film transistor ST in the third direction Z. Because the first interlayer insulating film 141 has a predefined dielectric constant, a capacitor may be composed of the capacitor electrode CAE, the gate electrode G, and the first interlayer insulating film 141 located therebetween. According to some embodiments, the capacitor electrode CAE may be formed as a single layer or a multi-layer made of one of molybdenum (Mo), aluminum (Al), chromium (Cr), gold (Au), titanium (Ti), nickel (Ni), neodymium (Nd), and copper (Cu), or an alloy thereof. However, embodiments according to the present disclosure are not limited thereto.

The second interlayer insulating film 142 may be located on the capacitor electrode CAE. According to some embodiments, the second interlayer insulating film 142 may be composed of an inorganic film, for example a silicon nitride layer, a silicon oxy nitride layer, a silicon oxide layer, a titanium oxide layer, or an aluminum oxide layer. However, embodiments according to the present disclosure are not limited thereto. In FIG. 5, the second interlayer insulating film 142 is shown as a single layer. However, the second interlayer insulating film 142 may be composed of a plurality of inorganic films.

The source electrode S and the drain electrode D may be located on the second interlayer insulating film 142. The source electrode S and the drain electrode D may be connected to the active layer respectively via contact holes extending through the first interlayer insulating film 141 and the second interlayer insulating film 142. In one example, each of the source electrode S and the drain electrode D may be formed as a single layer or a multi-layer made of one of molybdenum (Mo), aluminum (Al), chromium (Cr), gold (Au), titanium (Ti), nickel (Ni), neodymium (Nd) and copper (Cu), or an alloy thereof. However, embodiments according to the present disclosure are not limited thereto.

The planarization film 160 may be located on the source electrode S and the drain electrode D. According to some embodiments, the planarization film 160 may be composed of an organic film made of acryl resin, epoxy resin, phenolic resin, polyamide resin, polyimide resin, etc. However, embodiments according to the present disclosure are not limited thereto. According to some embodiments, the planarization film 160 may be composed of a plurality of layers. In this connection, at least one connection electrode extending through the plurality of layers to connect the anode and the drain electrode D to each other may be further arranged.

The light emission element layer EML may include a light emission element LEL and a bank 190 arranged on the planarization film 160.

Each light emission element LEL may include a pixel electrode 171, a light-emissive layer 172, and the common electrode 173. The pixel electrode 171 may be located on the planarization film 160. The pixel electrode 171 may be connected to the drain electrode D via a contact hole extending through the planarization film 160. However, embodiments according to the present disclosure are not limited thereto. According to some embodiments, the pixel electrode 171 may be connected to the source electrode S via a contact hole extending through the planarization film 160.

In one example, in a top emission structure in which light is emitted from the light-emissive layer 172 toward the common electrode 173, the pixel electrode 171 may be made of a material or a stack structure having a higher reflectance such as a stack structure of aluminum and titanium (Ti/Al/Ti), and a stack structure of silver and ITO (ITO/Ag/ITO), a stack structure of aluminum and ITO (ITO/Al/ITO), an APC alloy, or stack structure of an APC alloy and ITO (ITO/APC/ITO). However, embodiments according to the present disclosure are not limited thereto. In this connection, the APC alloy may include an alloy of silver (Ag), palladium (Pd), and copper (Cu).

The bank 190 may be arranged to cover an edge of the pixel electrode 171. In one example, the bank 190 may be composed of an organic film such as acryl resin, epoxy resin, phenolic resin, polyamide resin, polyimide resin, etc. However, embodiments according to the present disclosure are not limited thereto.

The light-emissive layer 172 may be arranged on the pixel electrode 171 and the bank 190. The light-emissive layer 172 may include an organic material and thus emit light of a predefined color. For example, the light-emissive layer 172 includes a hole transporting layer, an organic material layer, and an electron transporting layer.

The common electrode 173 may be arranged on the light-emissive layer 172. The common electrode 173 may be arranged to cover the light-emissive layer 172. A capping layer may be formed on the common electrode 173.

According to some embodiments, the common electrode 173 may be made of a transparent conductive material (TCO) such as ITO and IZO that may transmit light therethrough, or a semi-transmissive conductive material such as magnesium (Mg), silver (Ag), or an alloy of magnesium (Mg) and silver (Ag). However, embodiments according to the present disclosure are not limited thereto. When the common electrode 173 is made of the semi-transmissive conductive material, the light emission efficiency may be increased via a microcavity.

The encapsulation layer ENP may be arranged on the common electrode 173. The encapsulation layer ENP may be composed of at least one inorganic film to prevent penetration of oxygen or moisture into the light emission element layer EML, and at least one organic film to protect the light emission element layer EML from foreign materials such as dust.

The encapsulation layer ENP may include a first encapsulation inorganic film TFE1, an encapsulation organic film TFE2, and a second encapsulation inorganic film TFE3.

The first encapsulation inorganic film TFE1 may be arranged on the common electrode 173. The encapsulation organic film TFE2 may be arranged on the first encapsulation inorganic film TFE1. The second encapsulation inorganic film TFE3 may be located on the encapsulation organic film TFE2. According to some embodiments, each of the first encapsulation inorganic film TFE1 and the second encapsulation inorganic film TFE3 may be composed of a multilayer in which one or more inorganic films among a silicon nitride layer, a silicon oxynitride layer, a silicon oxide layer, a titanium oxide layer, and an aluminum oxide layer are stacked alternately with each other. However, embodiments according to the present disclosure are not limited thereto. According to some embodiments, the encapsulation organic film TFE2 may include an organic film made of acrylic resin, epoxy resin, phenolic resin, polyamide resin, polyimide resin, etc. However, embodiments according to the present disclosure are not limited thereto.

Figure 4:
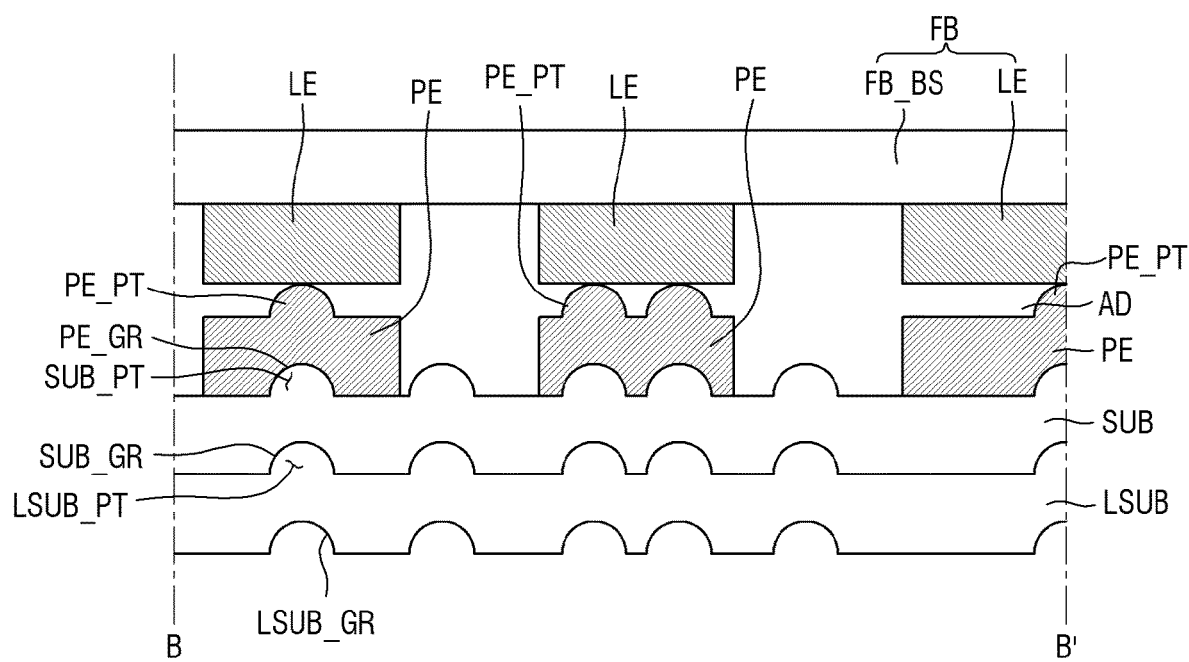
FIG. 4 is a cross-sectional view taken along a line B-B' in FIG. 1.

FIG. 4 is a cross-sectional view taken along the line B-B' in FIG. 1. FIG. 5 is a plan view of a lower substrate according to some embodiments.

Referring to FIG. 1, FIG. 2, FIG. 4, and FIG. 5, in the pad area PA, a plurality of pad electrodes PE and a plurality of lead electrodes LE may be located between the base substrate SUB of the display panel DP and the base member FB_BS of the connection circuit board FB.

As shown in FIG. 5, each of the pad electrode PE and the lead electrode LE may have an approximate rectangular shape elongate in the second direction Y in a plan view. However, embodiments according to the present disclosure are not limited thereto. Each of the pad electrode PE and the lead electrode LE may have various planar shapes such as a square, a rhombus, and a parallelogram.

In FIG. 5, in a plan view, the pad electrode PE and the lead electrode LE are shown to have substantially the same size and entirely overlap each other in the third direction Z. However, embodiments according to the present disclosure are not limited thereto. A size of the pad electrode PE may differ from a size of the lead electrode LE. According to some embodiments, a width in the first direction X or a length in the second direction Y of the pad electrode PE may be greater or smaller than a width in the first direction X or a length in the second direction Y of the lead electrode LE.

The plurality of pad electrodes PE may be arranged at a regular pitch in the first direction X. The plurality of lead electrodes LE may be arranged at a predetermined pitch in the first direction X. However, embodiments according to the present disclosure are not limited thereto. The plurality of pad electrodes PE may be arranged at an irregular pitch in the first direction X. The plurality of lead electrodes LE may be arranged at an irregular pitch in the first direction X. As described above, the first protrusion LSUB_PT may be located on the top face of the pad electrode PE so as to contact the lead electrode LE facing toward the pad electrode PE.

Referring to FIGS. 4 and 5, at least one third protrusion PE_PT may be located on a single pad electrode PE. According to some embodiments, as shown in FIG. 2, on a cross-sectional view cut in the second direction Y, a plurality of the third protrusions PE_PT may be located on a single pad electrode PE. According to some embodiments, as shown in FIG. 4, on a cross-sectional view cut in the first direction X, one third protrusion PE_PT may be located on a single pad electrode PE. At least two third protrusions PE_PT may be located on a single pad electrode PE.

The number of the plurality of the third protrusions PE_PT may be the same as the number of the plurality of the third grooves PE_GR. The plurality of the third grooves PE_GR may be defined in each of bottom faces of the plurality of pad electrodes PE in a manner substantially the same as or similar to a manner in which the plurality of the third protrusions PE_PT may be arranged.

The number of the plurality of first grooves LSUB_GR, the number of the plurality of first protrusions LSUB_PT, the number of the plurality of second grooves SUB_GR, and the number of the plurality of second protrusions SUB_PT may be equal to each other. Each of the numbers of the plurality of first grooves LSUB_GR, the plurality of first protrusions LSUB_PT, the plurality of second grooves SUB_GR, and the plurality of second protrusions SUB_PT may be greater than the number of the plurality of the third protrusions PE_PT or the plurality of the third grooves PE_GR. That is, the plurality of the third protrusions PE_PT may overlap, in the third direction Z, only the first protrusions LSUB_PT overlapping the pad electrode PE in the third direction Z among the plurality of first protrusions LSUB_PT.

Referring to FIG. 5, the plurality of first protrusions LSUB_PT may be arranged at a random spacing in a plan view. The spacing in the first direction X or the spacing in the second direction Y between adjacent ones of the plurality of first protrusions LSUB_PT may not be uniform. As described above, at least some of the plurality of first protrusions LSUB_PT may be aligned with the plurality of first grooves LSUB_GR, the plurality of second grooves SUB_GR, the plurality of second protrusions SUB_PT, the plurality of the third grooves PE_GR, and the plurality of the third protrusions PE_PT in the third direction Z. Thus, the plurality of first grooves LSUB_GR may be arranged at a random spacing in a plan view. The plurality of second grooves SUB_GR may be arranged at a random spacing in a plan view. The plurality of second protrusions SUB_PT may be arranged at a random spacing in a plan view. The plurality of the third grooves PE_GR may be arranged at a random spacing in a plan view. The plurality of the third protrusions PE_PT may be arranged at a random spacing in a plan view.

An average pitch between adjacent ones of the plurality of first grooves LSUB_GR, an average pitch between adjacent ones of the plurality of first protrusions LSUB_PT, average pitch between adjacent ones of the plurality of second grooves SUB_GR, or an average pitch between adjacent ones of the plurality of second protrusions SUB_PT may be smaller than an average pitch between adjacent ones of the plurality of the third protrusions PE_PT or an average pitch between adjacent ones of the plurality of the third grooves PE_GR. According to some embodiments, an average pitch in the second direction Y between adjacent ones of the plurality of first grooves LSUB_GR, of the plurality of first protrusions LSUB_PT, of the plurality of second grooves SUB_GR or of the plurality of second protrusions SUB_PT may be substantially the same as an average pitch in the second direction Y between adjacent ones of the plurality of the third protrusions PE_PT or of the plurality of the third grooves PE_GR. However, an average pitch in the first direction X between adjacent ones of the plurality of first grooves LSUB_GR, of the plurality of first protrusions LSUB_PT, of the plurality of second grooves SUB_GR, or of the plurality of second protrusions SUB_PT may be smaller than an average pitch in the first direction X between adjacent ones of the plurality of the third protrusions PE_PT, or of the plurality of the third grooves PE_GR.

Referring to FIG. 4 and FIG. 5, some of the plurality of first protrusions LSUB_PT may be arranged to overlap the pad electrode PE or the lead electrode LE in the third direction Z, while the other of the plurality of first protrusions LSUB_PT may be arranged so as not to overlap with the pad electrode PE or the lead electrode LE in the third direction Z. Likewise, some of the plurality of first grooves LSUB_GR, some of the plurality of second grooves SUB_GR, some of the plurality of second protrusions SUB_PT may be arranged to overlap the pad electrode PE or the lead electrode LE in the third direction Z, while the other of the plurality of first grooves LSUB_GR, the other of the plurality of second grooves SUB_GR, the other of the plurality of second protrusions SUB_PT may be arranged so as not to overlap with the pad electrode PE or lead electrode LE in the third direction Z.

The plurality of the third protrusions PE_PT and the other of the plurality of second protrusions SUB_PT not overlapping with the pad electrode PE or the lead electrode LE may directly contact the adhesive member AD. Thus, an adhesion area of the adhesive member AD may increase.

As shown in a left side of FIG. 4, a center of FIG. 4, and FIG. 5, the first groove LSUB_GR, the first protrusion LSUB_PT, the second groove SUB_GR, the second protrusion SUB_PT, the third groove PE_GR and the third protrusion PE_PT may be arranged so as to entirely overlap with a single pad electrode PE.

As shown in a right side of FIG. 4 and in FIG. 5, at least one of the plurality of first protrusions LSUB_PT, or the first groove LSUB_GR, the second groove SUB_GR, the second protrusion SUB_PT, the third groove PE_GR, or the third protrusion PE_PT overlapping the at least one first protrusion may be arranged to overlap a boundary of the pad electrode PE or a boundary of the lead electrode LE in the third direction Z.

A size of each of the third groove PE_GR and the third protrusion PE_PT overlapping, in the third direction Z, with a boundary of pad electrode PE or a boundary of the lead electrode LE may be smaller than a size of each of the first groove LSUB_GR, the first protrusion LSUB_PT, and the second groove SUB_GR, and the second protrusion SUB_PT overlapping, in the third direction Z, therewith. A size of each of the third groove PE_GR and the third protrusion PE_PT overlapping the boundary of the pad electrode PE or the boundary of the lead electrode LE in the third direction Z may be smaller than a size of each of the third groove PE_GR and the third protrusion PE_PT not overlapping the boundary of the pad electrode PE or the boundary of the lead electrode LE in the third direction Z.

A shape, for example, a planar shape or a cross-sectional shape of each of the third groove PE_GR and the third protrusion PE_PT overlapping with the boundary of the pad electrode PE or the boundary of the lead electrode LE in the third direction Z may be different from a shape, for example, a planar shape or a cross-sectional shape of each of the first groove LSUB_GR, the first protrusion LSUB_PT, the second groove Z SUB_GR, and the second protrusion SUB_PT overlapping therewith in the third direction Z.

A shape of each of the third groove PE_GR and the third protrusion PE_PT overlapping the boundary of the pad electrode PE or the boundary of the lead electrode LE in the third direction Z may be different from a shape of each of the third groove PE_GR and the third protrusion PE_PT not overlapping the boundary of the pad electrode PE or the boundary of the lead electrode LE in the third direction Z.

A shape of each of the third groove PE_GR and the third protrusion PE_PT that do not overlap with the boundary of the pad electrode PE or the boundary of the lead electrode LE in the third direction Z may be substantially the same as or similar to a shape of each of the first groove LSUB_GR, the first protrusion LSUB_PT, the second groove SUB_GR and the second protrusion SUB_PT. In one example, the shape may refer to a planar shape or a cross-sectional shape.

In one example, as shown in FIG. 4, in a cross section view, each of the third groove PE_GR and the third protrusion PE_PT which do not overlap, in the third direction Z, with the boundary of the pad electrode PE or the boundary of the lead electrode LE may have a roughly semicircular shape. A shape of each of the third groove PE_GR and the third protrusion PE_PT overlapping the boundary of the pad electrode PE or the boundary of the lead electrode LE in the third direction Z may be an approximate quadrant shape. However, embodiments according to the present disclosure are not limited thereto.

In the display device 1 according to some embodiments, the pad electrode PE and the lead electrode LE are electrically connected to each other via the third protrusion PE_PT. Thus, in accordance with the present disclosure, when connecting the connection circuit board FB and the display panel DP to each other, a connection fault such as an open defect or a short circuit defect may be suppressed, which may be otherwise caused by flow of conductive particles when the connection circuit board FB is bonded to the display panel DP using an anisotropic conductive film containing the conductive particles as in a conventional manner. Further, in the display device 1 according to one implementation, the adhesive member AD not containing the conductive particles may be used to reduce a cost of the device. Furthermore, as will described later, the third protrusion PE_PT may be applied to the pad electrode PE connected to the driver member DDM, thereby flexibly coping with a design change of the display device 1.

Figure 6:
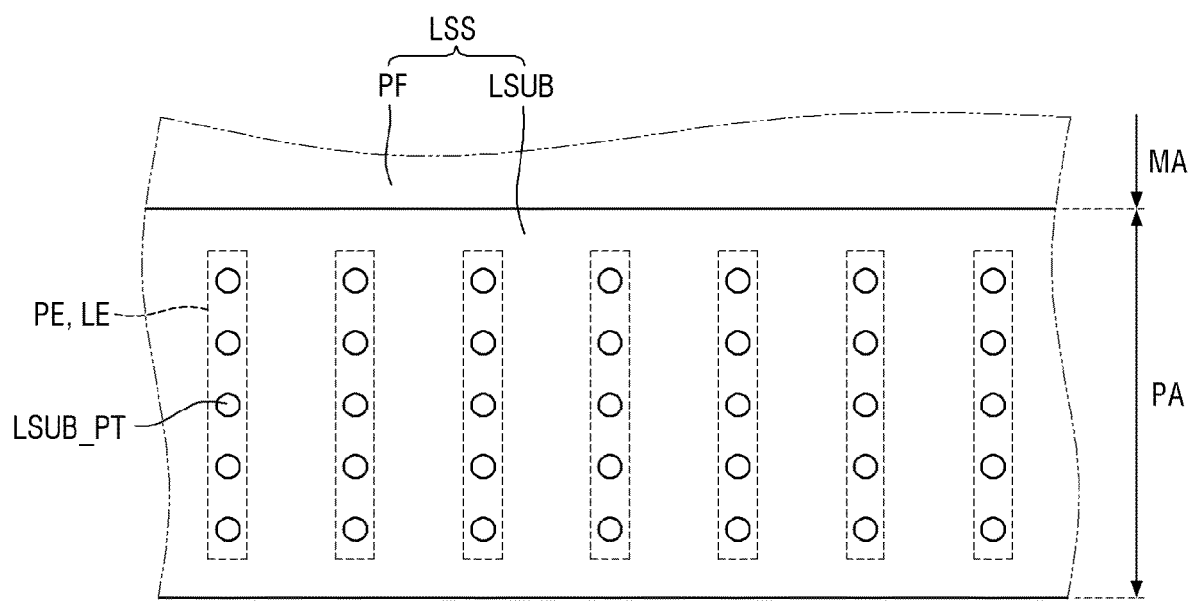
FIG. 6 is a plan view of a lower substrate according to some embodiments.

FIG. 6 is a plan view of a lower substrate according to some embodiments.

The implementation of FIG. 6 is different from the implementation of FIGS. 1 to 5 mainly in terms of an arrangement of the plurality of first protrusions LSUB_PT.

Referring to FIG. 6, the plurality of first protrusions LSUB_PT may be arranged so as to overlap each of the plurality of pad electrodes PE or each of the plurality of lead electrodes LE in the third direction Z. As shown in FIG. 6, in a plan view, the plurality of first protrusions LSUB_PT may be located only within a boundary of each of the plurality of pad electrodes PE or only within a boundary of each of the plurality of lead electrodes LE, and may not be located outside the boundary of each of the plurality of pad electrodes PE or the boundary of each of the plurality of lead electrodes LE.

The plurality of first protrusions LSUB_PT may be arranged and spaced apart from each other at a constant pitch in the first direction X. The pitch in the first direction X between adjacent ones of the plurality of first protrusions LSUB_PT may be substantially the same as or similar to a pitch in the first direction X between adjacent ones of the plurality of pad electrodes PE or a pitch in the first direction X between adjacent ones of the plurality of lead electrodes LE. Thus, an open defect between the pad electrode PE and the lead electrode LE may be prevented and alignment between the connection circuit board FB and display panel DP may be easily performed, compared to a case where the plurality of first protrusions LSUB_PTs are randomly spaced from each other.

In one pad electrode PE or one lead electrode LE, the plurality of first protrusions LSUB_PT may be arranged and spaced apart from each other at a constant pitch in the second direction Y. However, embodiments according to the present disclosure are not limited thereto.

Referring further to FIG. 2 and FIG. 4, as described above, the first groove LSUB_GR, the second groove SUB_GR, the second protrusion SUB_PT, the third groove PE_GR, and the third protrusion PE_PT may overlap with the first protrusion LSUB_PT in the third direction Z. A positional relationship of the first groove LSUB_GR, the second groove SUB_GR, the second protrusion SUB_PT, the third groove PE_GR and the third protrusion PE_PT relative to the pad electrode PE or the lead electrode LE may be substantially the same as or similar to a positional relationship of the first protrusion LSUB_PT relative to the pad electrode PE or the lead electrode LE. In a plan view, each of the first groove LSUB_GR, the second groove SUB_GR, the second protrusion SUB_PT, the third groove PE_GR, and the third protrusion PE_PT may be positioned in a manner substantially the same as or similar to a manner in which the first protrusion LSUB_PT may be positioned.

When a position of the first protrusion LSUB_PT has been changed as shown in the implementation of FIG. 6, a position of each of the first groove LSUB_GR, the second groove SUB_GR, the second protrusion SUB_PT, the third groove PE_GR, and the third protrusion PE_PT may also be changed in a corresponding manner thereto. In one example, in a plan view, each of the first groove LSUB_GR, the second groove SUB_GR, the second protrusion SUB_PT, the third groove PE_GR and the third protrusion PE_PT may be positioned only within the boundary of the pad electrode PE or the boundary of the lead electrode LE as the first protrusion LSUB_PT may be so.

In a plan view, the plurality of first groove LSUB_GR may be spaced from each other in the X direction by substantially the same spacing by which the pad electrodes PE may be spaced from each other in the X direction or the lead electrode LE may be spaced from each other in the X direction as the first protrusion LSUB_PT may be so. The plurality of second grooves SUB_GR may be spaced from each other in the X direction by substantially the same spacing by which the pad electrodes PE may be spaced from each other in the X direction or the lead electrode LE may be spaced from each other in the X direction as the first protrusion LSUB_PT may be so. The plurality of second protrusions SUB_PT may be spaced from each other in the X direction by substantially the same spacing by which the pad electrodes PE may be spaced from each other in the X direction or the lead electrode LE may be spaced from each other in the X direction as the first protrusion LSUB_PT may be so. The plurality of the third grooves PE_GR may be spaced from each other in the X direction by substantially the same spacing by which the pad electrodes PE may be spaced from each other in the X direction or the lead electrode LE may be spaced from each other in the X direction as the first protrusion LSUB_PT may be so. The plurality of the third protrusions PE_PT may be spaced from each other in the X direction by substantially the same spacing by which the pad electrodes PE may be spaced from each other in the X direction or the lead electrode LE may be spaced from each other in the X direction as the first protrusion LSUB_PT may be so.

The implementation of FIG. 6 is substantially the same as or similar to the implementation of FIGS. 1 to 5 except for the arrangement of the plurality of first protrusions LSUB_PTs. Thus, hereinafter, duplicate descriptions therebetween may be omitted.

Figure 7:
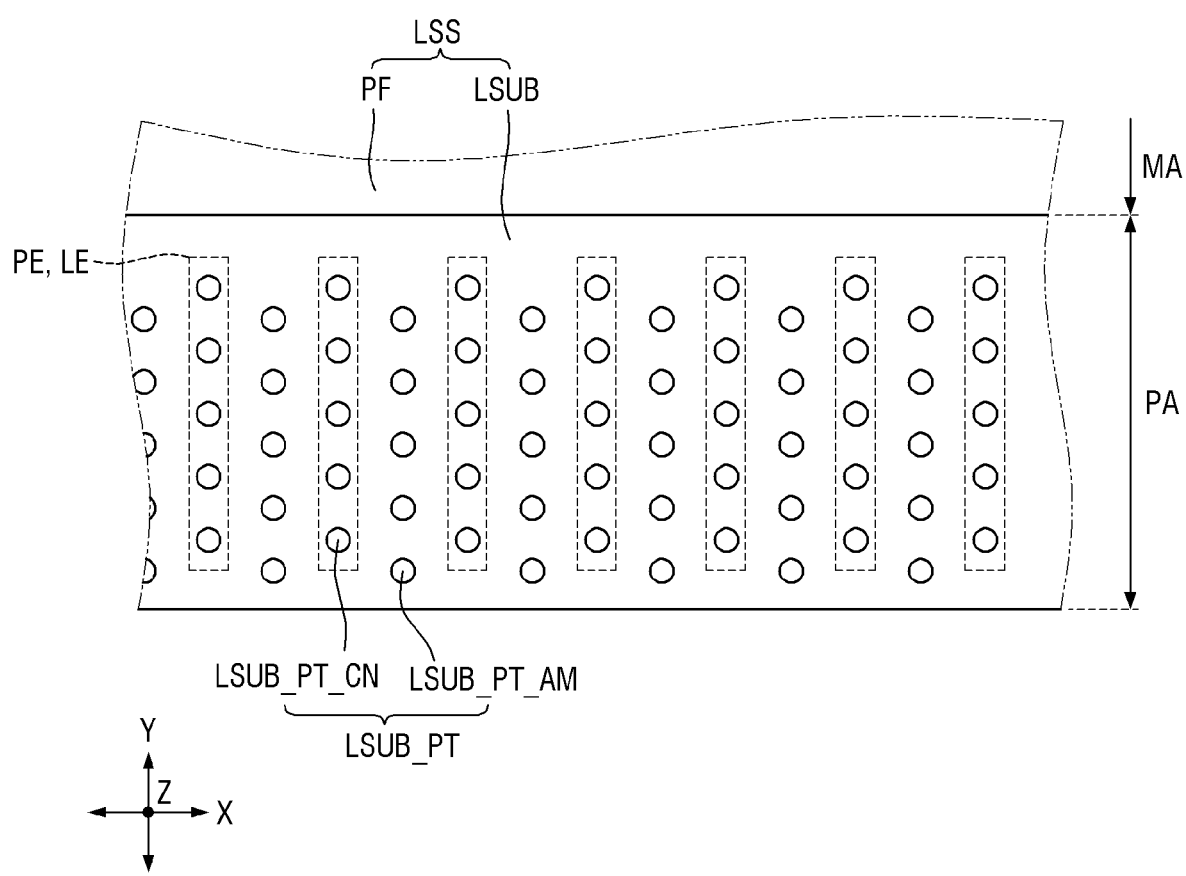
FIG. 7 is a plan view of a lower substrate according to some embodiments.

FIG. 7 is a plan view of a lower substrate according to some embodiments.

The implementation of FIG. 7 is different from the implementation of FIGS. 1 to 5 mainly in that the plurality of first protrusions LSUB_PT in FIG. 7 include a plurality of overlapping protrusions LSUB_PT_CN and a plurality of alignment protrusions LSUB_PT_AM.

Referring to FIG. 7, the plurality of first protrusions LSUB_PT may include the plurality of overlapping protrusions LSUB_PT_CN and the plurality of alignment protrusions LSUB_PT_AM.

In a plan view, the plurality of overlapping protrusions LSUB_PT_CN may be located within the boundary (e.g., within a footprint) of the pad electrode PE or the lead electrode LE. The plurality of overlapping protrusions LSUB_PT_CN may be spaced from each other in the first direction X by the substantially the same pitch by which the pad electrodes PE (or the lead electrodes LE) may be spaced from each other in the first direction X. The plurality of overlapping protrusions LSUB_PT_CN located in one pad electrode PE or one lead electrode LE may be spaced apart from each other by a constant spacing in the second direction Y. However, embodiments according to the present disclosure are not limited thereto. In a similar manner to FIG. 5, the plurality of overlapping protrusions LSUB_PT_CN may be arranged randomly.

The plurality of alignment protrusions LSUB_PT_AM may be located outside the boundary of the pad electrode PE or the lead electrode LE in a plan view. One column of the plurality of alignment protrusions LSUB_PT_AM may be located between adjacent ones of the plurality of the pad electrodes PE or the lead electrodes LE. The alignment protrusion LSUB_PT_AM may be referred to as a non-overlapping protrusion. A column of the plurality of alignment protrusions LSUB_PT_AM may be located between adjacent two columns of the plurality of overlapping protrusions LSUB_PT_CN. The plurality of alignment protrusions LSUB_PT_AM may function as an alignment mark when the lower substrate LSUB and the display panel DP are bonded to each other, or when the display panel DP and the connection circuit board FB are bonded to each other.

The plurality of overlapping protrusions LSUB_PT_CN may constitute a plurality of columns, each extending in the second direction Y. The plurality of alignment protrusions LSUB_PT_AM may constitute a plurality of columns, each extending in the second direction Y. Each column of the plurality of overlapping protrusions LSUB_PT_CN may overlap with each of the plurality of pad electrodes PE or the lead electrodes LE in the third direction Z. Each column of the plurality of alignment protrusions LSUB_PT_AM may be located between adjacent ones of the plurality of pad electrodes PE or lead electrodes LE or between adjacent ones of the columns of the plurality of overlapping protrusions LSUB_PT_CN.

A pitch in the first direction X between adjacent ones of the plurality of columns of the plurality of overlapping protrusions LSUB_PT_CN may be substantially the same as a pitch in the first direction X between adjacent ones of the plurality of pad electrodes PE or lead electrodes LE. A pitch in the first direction X between adjacent ones of the plurality of columns of the plurality of alignment protrusions LSUB_PT_AM may be substantially the same as the pitch in the first direction X between adjacent ones of the plurality of pad electrodes PE or lead electrodes LE.

In a plan view, the outermost overlapping protrusions LSUB_PT_CNs located among the plurality of overlapping protrusions LSUB_PT_CNs, for example, bottom or top overlapping protrusions LSUB_PT_CNs in FIG. 7 may be aligned with each other in the first direction X. However, embodiments according to the present disclosure are not limited thereto.

In a plan view, the outermost alignment protrusions LSUB_PT_AM among the plurality of alignment protrusions LSUB_PT_AM, for example, top or bottom alignment protrusions LSUB_PT_AM in FIG. 7 may be aligned or not in the first direction X.

In FIG. 7, the overlapping protrusion LSUB_PT_CN and the alignment protrusion LSUB_PT_AM may have substantially the same or similar shape. A planar shape or a vertical dimension of the overlapping protrusion LSUB_PT_CN may be substantially the same as a planar shape or a vertical dimension of the alignment protrusion LSUB_PT_AM. However, embodiments according to the present disclosure are not limited thereto. The planar shape or the vertical dimension of the overlapping protrusion LSUB_PT_CN may be different from the planar shape or the vertical dimension of the alignment protrusion LSUB_PT_AM.

The implementation of FIG. 7 is substantially the same as or similar to the implementation of FIGS. 1 to 5, except that the plurality of first protrusions LSUB_PT include the plurality of overlapping protrusions LSUB_PT_CN and the plurality of alignment protrusions LSUB_PT_AM. Thus, hereinafter, some duplicate descriptions therebetween may be omitted.

Figure 8:
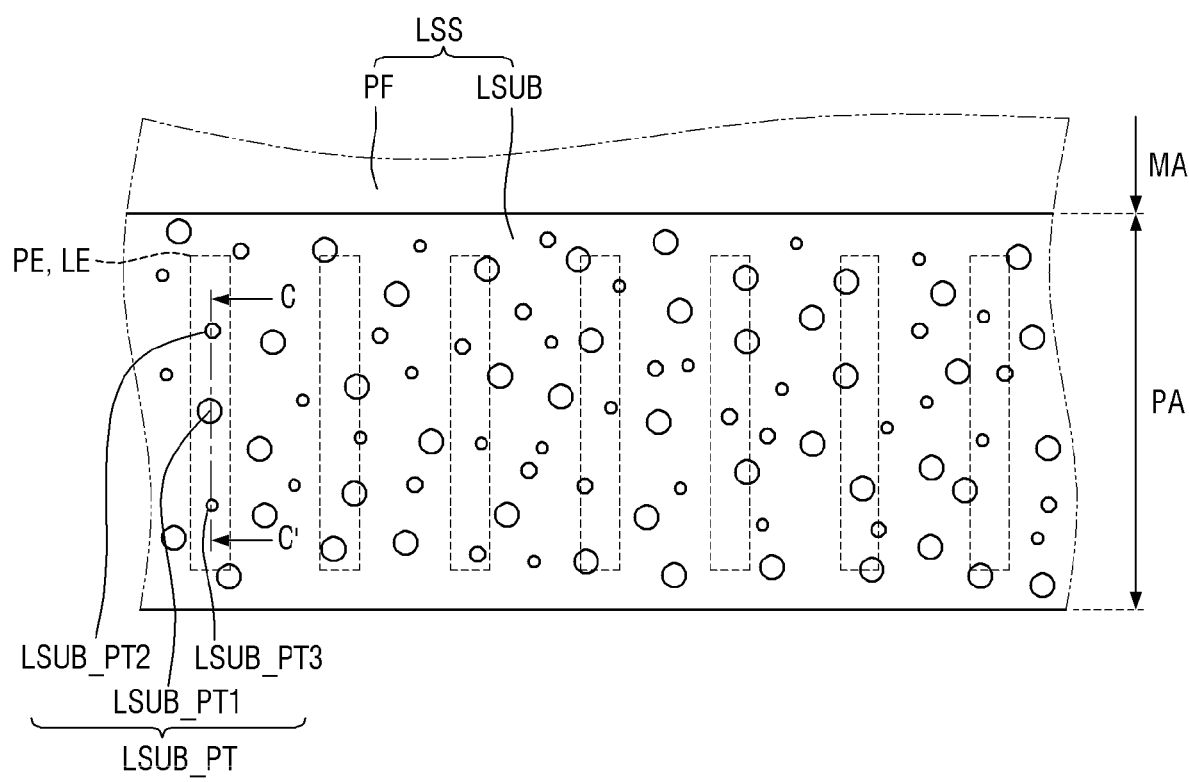
FIG. 8 is a plan view of a lower substrate according to some embodiments.
Figure 8:
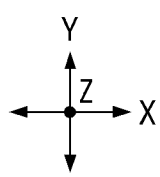
Figure 9:
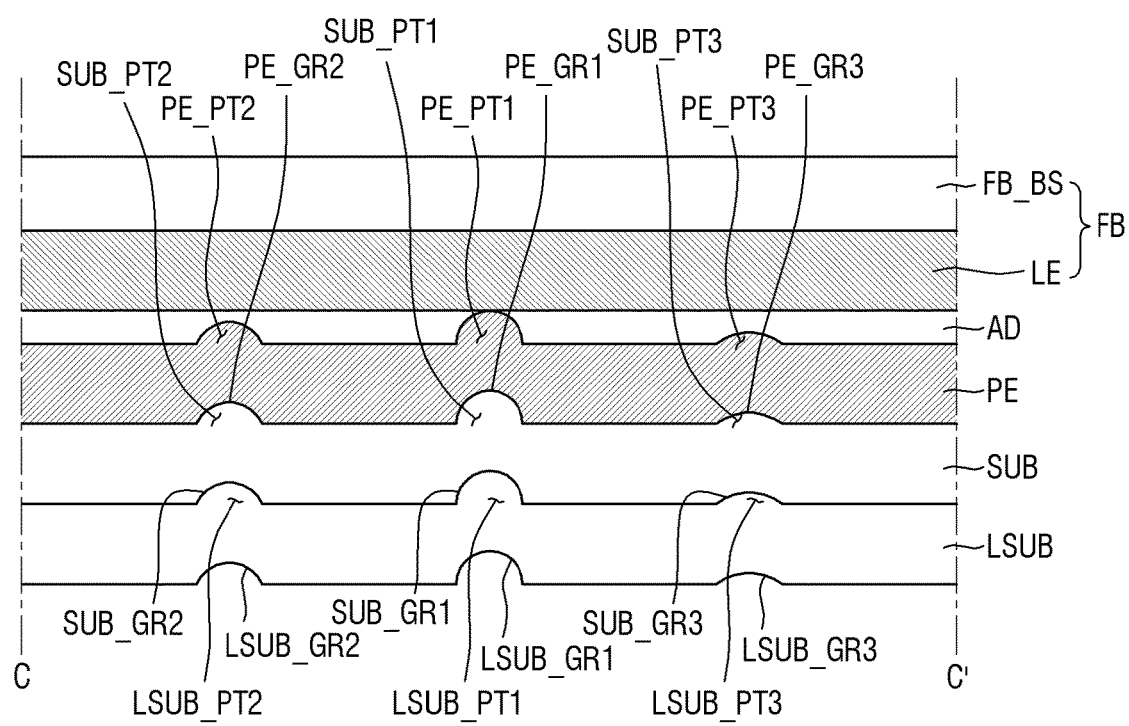
FIG. 9 is a cross-sectional view taken along a line C-C' in FIG. 8.

FIG. 8 is a plan view of a lower substrate according to still yet another implementation. FIG. 9 is a cross-sectional view taken along a line C-C' in FIG. 8.

The implementation of FIGS. 8 and 9 is different from the implementation of FIGS. 1 to 5 mainly in that the plurality of first protrusions LSUB_PTs have different sizes in this implementation.

Referring to FIGS. 8 and 9, the plurality of first protrusions LSUB_PT may include a plurality of first-first protrusions LSUB_PT1, a plurality of first-second protrusions LSUB_PT2 and a plurality of first-third protrusions LSUB_PT3 having different sizes.

A size of the first-first protrusion LSUB_PT1 may be greater than a size of each of the first-second protrusion LSUB_PT2 and the first-third protrusion LSUB_PT3. A size of the first-second protrusion LSUB_PT2 may be greater than a size of the first-third protrusion LSUB_PT3. In FIGS. 8 and 9, three types of first protrusions LSUB_PT are illustrated. However, the number of types of the first protrusions LSUB_PT is not limited thereto.

As shown in FIG. 8, in a plan view, a width or an area of the first-first protrusion LSUB_PT1 may be larger than that of each of the first-second protrusion LSUB_PT2 and the first-third protrusion LSUB_PT3. A width or an area of the first-second protrusion LSUB_PT2 may be larger than that of the first-third protrusion LSUB_PT3.

As shown in FIG. 9, a vertical dimension of the first-first protrusion LSUB_PT1 in a cross section view may be larger than that of each of the first-second protrusion LSUB_PT2 and the first-third protrusion LSUB_PT3. The vertical dimension of the first-second protrusion LSUB_PT2 may be greater than that of the first-third protrusion LSUB_PT3. The first-first protrusion LSUB_PT1 may be in direct contact with the lead electrode LE, while each of the first-second protrusion LSUB_PT2 and the first-third protrusion LSUB_PT3 may not be in direct contact with the lead electrode LE.

When the connection circuit board FB and the display panel DP are bonded to each other, the first-first protrusion LSUB_PT1 among the plurality of first protrusions LSUB_PTs may first contact the lead electrode. The first-second protrusion LSUB_PT2 and the first-third protrusion LSUB_PT3 may prevent an excessive force from being applied to the connection circuit board FB or the display panel DP during bonding between the connection circuit board FB and the display panel DP. Thus, the pad electrode PE and the lead electrode LE may be prevented from being in close contact with each other, such that a spacing in the third direction Z between the pad electrode PE and the lead electrode LE may be kept constant.

Referring to FIGS. 8 and 9, both of planar sizes and vertical dimensions of the first-first protrusion LSUB_PT1, the first-second protrusion LSUB_PT2, and the first-third protrusion LSUB_PT3 may be different from each other. However, embodiments according to the present disclosure are not limited thereto. While the first-first protrusion LSUB_PT1, the first-second protrusion LSUB_PT2, and the first-third protrusion LSUB_PT3 may have different planar sizes, but may have the same the vertical dimension. Alternatively, the first-first protrusion LSUB_PT1, the first-second protrusion LSUB_PT2, and the first-third protrusion LSUB_PT3 may have the same planar size, and have the same vertical dimension.

Referring to FIG. 9, each of the first groove LSUB_GR, the second groove SUB_GR, the second protrusion SUB_PT, the third groove PE_GR, and the third protrusion PE_PT may have a vertical dimension or a depth corresponding to the vertical dimension of the first protrusion LSUB_PT.

For example, the first groove LSUB_GR may include a first-first groove LSUB_GR1, a first-second groove LSUB_GR2, and a first-third groove LSUB_GR3 overlapping, in the third direction Z, respectively, with the first-first protrusion LSUB_PT1, the first-second protrusion LSUB_PT2 and the first-third protrusion LSUB_PT3. A depth of the first-first groove LSUB_GR1 may be greater than that of the first-second groove LSUB_GR2. The depth of the first-second groove LSUB_GR2 may be greater than a depth of the first-third groove LSUB_GR3.

The second groove SUB_GR may include a second-first groove SUB_GR1, a second-second groove SUB_GR2 and a second-third groove SUB_GR3 overlapping with the first-first protrusion LSUB_PT1, the first-second protrusion LSUB_PT2 and the first-third protrusion LSUB_PT3 in the third direction Z, respectively. A depth of the second-first groove SUB_GR1 may be greater than a depth of the second-second groove SUB_GR2. The depth of the second-second groove SUB_GR2 may be greater than a depth of the second-third groove SUB_GR3.

The second protrusion SUB_PT may include a second-first protrusion SUB_PT1, a second-second protrusion SUB_PT2 and a second-third protrusion SUB_PT3 overlapping, in the third direction Z, with the second-first groove SUB_GR1, the second-second groove SUB_GR2 and the second-third groove SUB_GR3, respectively. A vertical dimension of the second-first protrusion SUB_PT1 may be larger than that of the second-second protrusion SUB_PT2. The vertical dimension of the second-second protrusion SUB_PT2 may be larger than a vertical dimension of the second-third protrusion SUB_PT3.

The third groove PE_GR may include a third-first groove PE_GR1, a third-second groove PE_GR2 and a third-third groove PE_GR3 overlapping, in the third direction Z, respectively, with the second-first protrusion SUB_PT1, the second-second protrusion SUB_PT2 and the second-third protrusion SUB_PT3. A depth of the third-first groove PE_GR1 may be greater than that of the third-second groove PE_GR2. The depth of the third-second groove PE_GR2 may be greater than a depth of the third-third groove PE_GR3.

The third protrusion PE_PT may include a third-first protrusion PE_PT1, a third-second protrusion PE_PT2 and a third-third protrusion PE_PT3 overlapping, in the third direction Z, respectively, with the third-first groove PE_GR1, the third-second groove PE_GR2 and the third-third groove PE_GR3. A vertical dimension of the third-first protrusion PE_PT1 may be larger than that of the third-second protrusion PE_PT2. The vertical dimension of the third-second protrusion PE_PT2 may be larger than a vertical dimension of the third-third protrusion PE_PT3.

The implementation of FIGS. 8 and 9 is substantially the same or similar to the implementation of FIGS. 1 to 5, except that the plurality of first protrusions LSUB_PTs have different sizes. Thus, hereinafter, duplicate descriptions therebetween may be omitted.

Figure 10:
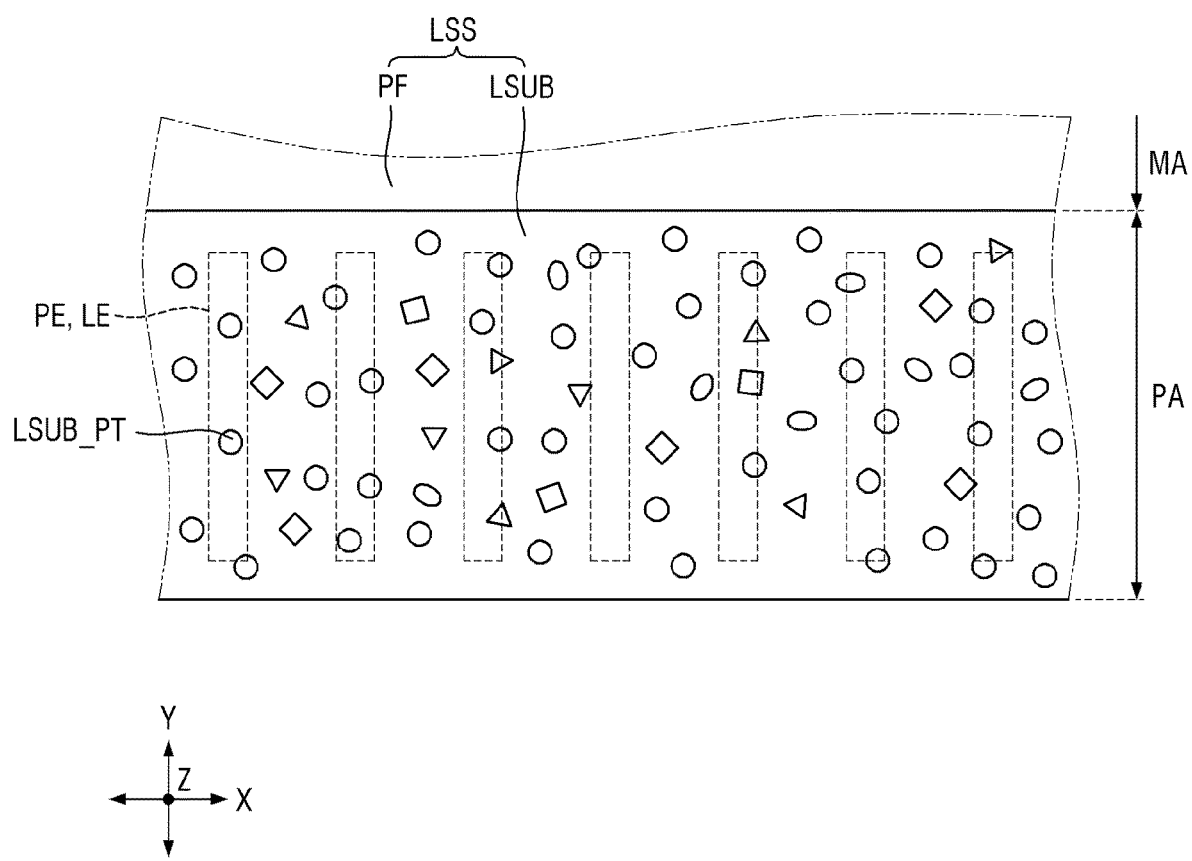
FIG. 10 is a plan view of a lower substrate according to some embodiments.

FIG. 10 is a plan view of a lower substrate according to some embodiments.

An implementation of FIG. 10 is different from the implementation of FIGS. 1 to 5 in that at least some of the plurality of first protrusions LSUB_PT have a planar shape different from that of the other thereof.

Referring to FIG. 10, the plurality of first protrusions LSUB_PT may have various planar shapes, such as a circle, a triangle, and a rectangle. As shown in FIG. 10, circular first protrusions LSUB_PTs, triangular first protrusions LSUB_PTs, and rectangular first protrusions LSUB_PTs may be arranged randomly in a plan view. In a plan view, the first protrusions LSUB_PTs overlapping with one pad electrode PE or one lead electrode LE may have the same planar shape, or may have different planar shapes.

The implementation of FIG. 10 is substantially the same as or similar to the implementation of FIGS. 1 to 5, except that at least some of the plurality of first protrusions LSUB_PT has a planar shape different from that of the rest thereof. Thus, hereinafter, duplicate descriptions therebetween may be omitted.

Figure 11:
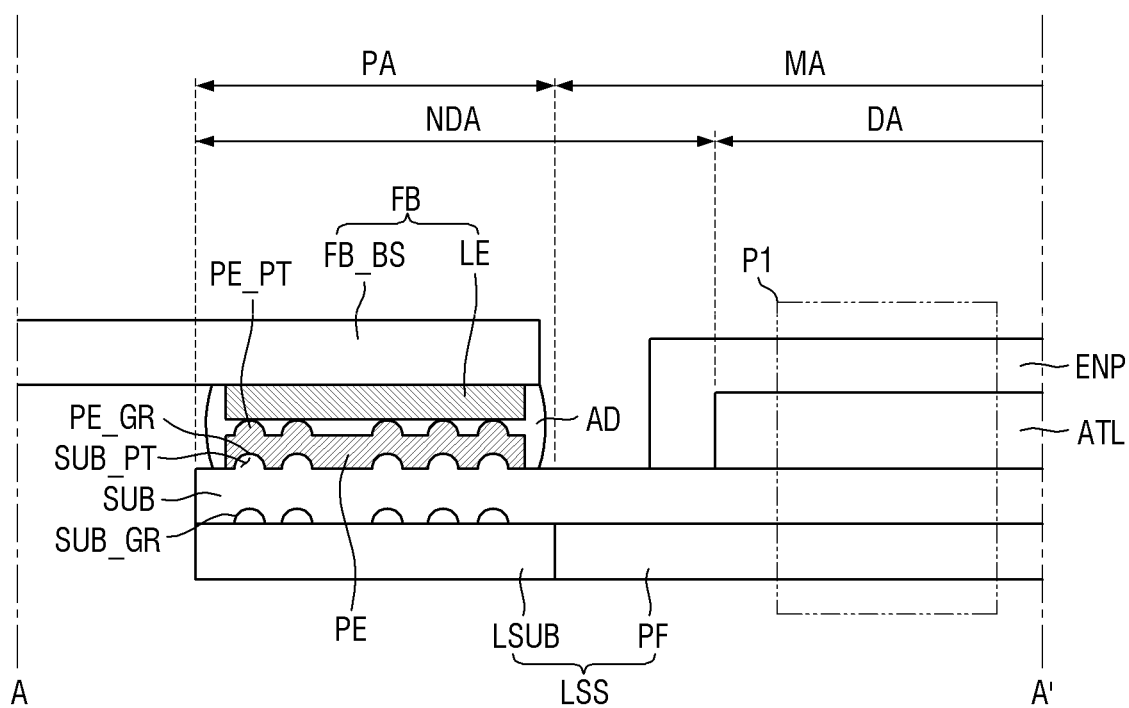
FIG. 11 is a cross-sectional view of a display device according to some embodiments.
Figure 11:
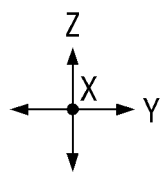

FIG. 11 is a cross-sectional view of a display device according to some embodiments.

The implementation of FIG. 11 is different from the implementation of FIGS. 1 to 5 in that the lower substrate LSUB does not include the first protrusion LSUB_PT and the first groove LSUB_GR.

Referring to FIG. 11, the base substrate SUB includes the plurality of second grooves SUB_GR and the plurality of second protrusions SUB_PT. The pad electrode PE includes the plurality of the third grooves PE_GR and the plurality of the third protrusions PE_PT. However, the lower substrate LSUB may not include the first protrusion LSUB_PT and the first groove LSUB_GR. In this case, the lower substrate LSUB may have a flat top face and a flat bottom face.

Unlike the implementation of FIG. 1 to FIG. 5, in this implementation, the lower substrate LSUB and the polymer film layer PF may be made of substantially the same or similar material.

According to some embodiments, each of the lower substrate LSUB and the polymer film layer PF may include a polymer film. In another example, each of the lower substrate LSUB and the polymer film layer PF may be made of polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), a cycloolefin polymer (COP), and the like. In another example, each of the lower substrate LSUB and the polymer film layer PF may include polyethylene terephthalate. However, the material of each of the lower substrate LSUB and the polymer film layer PF is not limited to the examples.

The lower substrate LSUB may include a functional layer on at least one face thereof. The functional layer may include, for example, a light absorbing layer. The light absorbing layer may contain a light absorbent material such as black pigment or dye. The light absorbing layer may be formed on the polymer film by coating or printing a black ink thereon.

As shown in the implementation of FIG. 11, when the first groove LSUB_GR and the first protrusion LSUB_PT are omitted, the second groove SUB_GR and the second protrusion SUB_PT of the base substrate SUB are referred to as a first groove and a first protrusion, respectively. The third groove PE_GR and the third protrusion PE_PT of the pad electrode PE may be referred to as a second groove and a second protrusion, respectively.

The implementation of FIG. 11 is substantially the same as or similar to the implementation of FIGS. 1 to 5, except that the lower substrate LSUB does not include the first protrusion LSUB_PT and the first groove LSUB_GR. Thus, hereinafter, some duplicate descriptions therebetween may be omitted.

Figure 12:
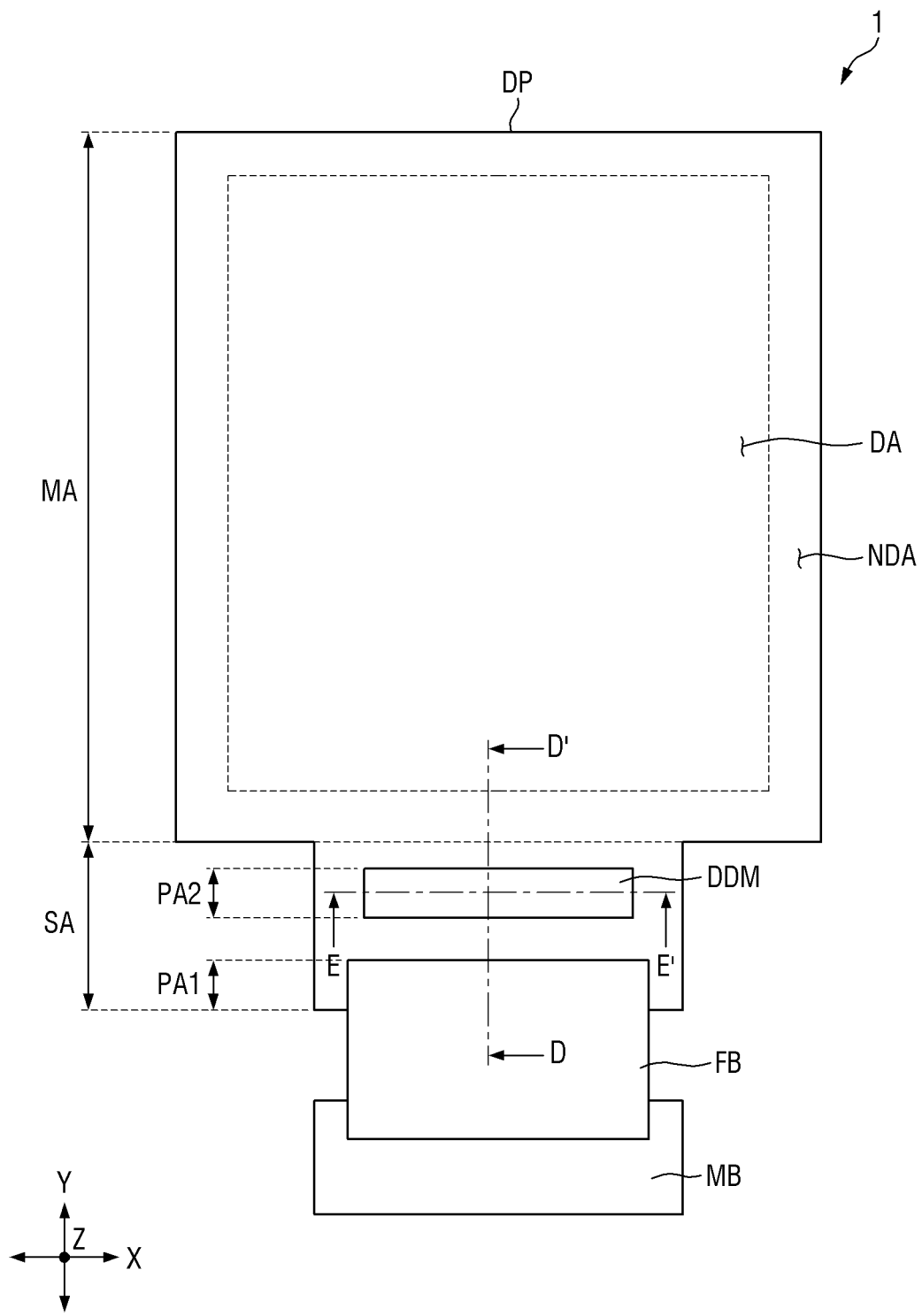
FIG. 12 is a plan view of a display device according to some embodiments.
Figure 13:
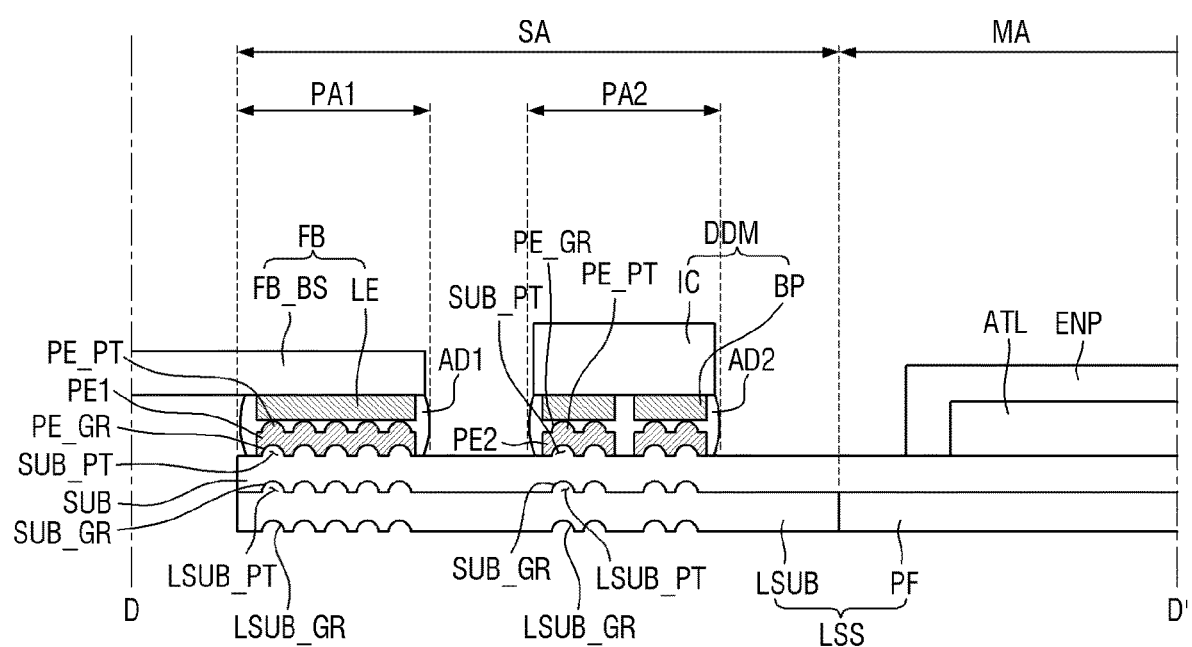
FIG. 13 is a cross-sectional view taken along a line D-D' in FIG. 12.
Figure 13:
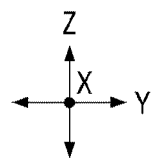
Figure 14:
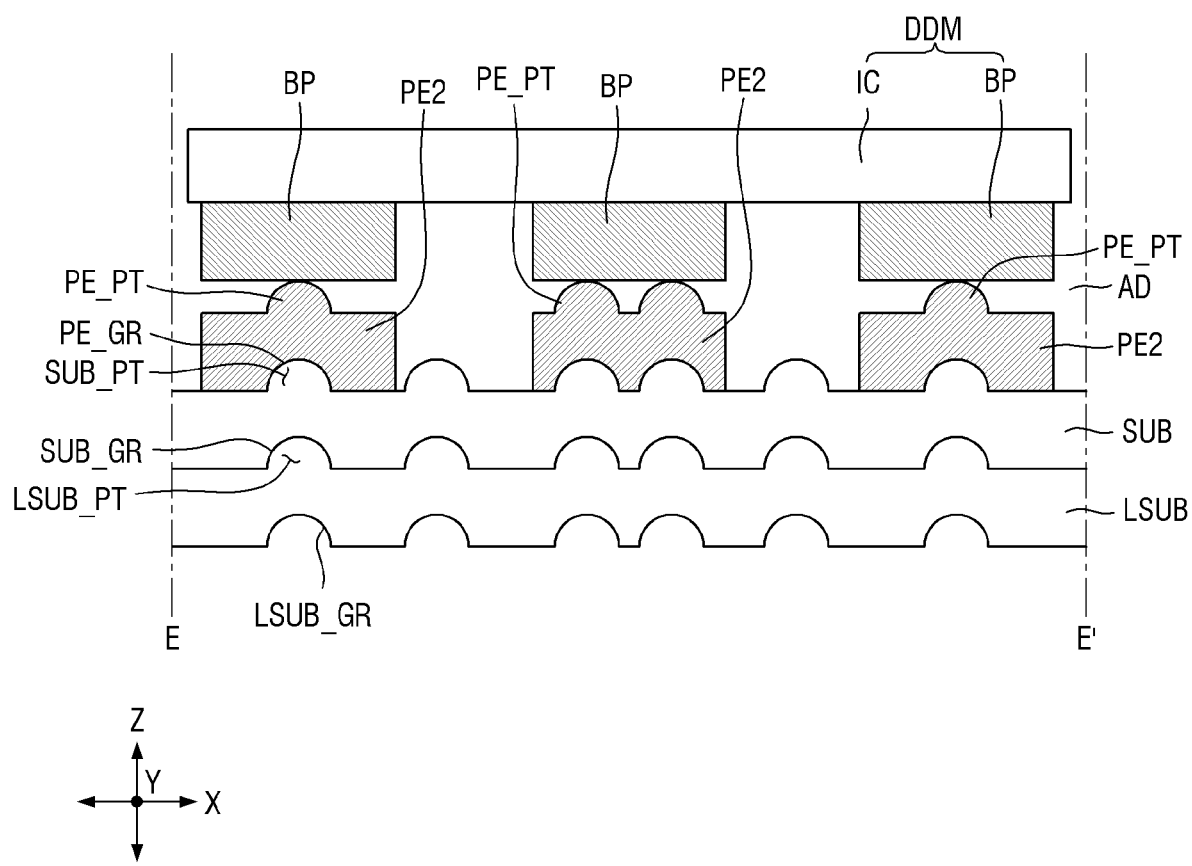
FIG. 14 is a cross-sectional view taken along a line E-E' in FIG. 12.

FIG. 12 is a plan view of a display device according to some embodiments. FIG. 13 is a cross-sectional view taken along a line D-D' in FIG. 12. FIG. 14 is a cross-sectional view taken along a line E-E' in FIG. 12.

The implementation of FIG. 12 to FIG. 14 is different from the implementation of FIG. 1 to FIG. 5 in that the driver member DDM is mounted on the display panel DP.

Referring to FIG. 12 and FIG. 13, the display panel DP may include a main area MA and an auxiliary area SA.

In a plan view, the main area MA may have a roughly rectangular shape. A display area DA may be located in the main area MA.

The auxiliary area SA may be connected to one side of the main area MA. As shown in FIG. 12, in one example, the auxiliary area SA may be connected to a short-side extending in the first direction X of the main area MA as located at a bottom of FIG. 12. A width of the auxiliary area SA may be smaller than that of the main area MA. Accordingly, each of both corners located at a bottom of the display panel DP may have a planar shape cut into an "L" shape. However, the shape of the auxiliary area SA, the location to which the auxiliary area SA is connected, and a width of the auxiliary area SA are not limited thereto.

The auxiliary area SA may include a first pad area PA1 to which the connection circuit board FB is attached, and a second pad area PA2 to which the driver member DDM is attached.

The pad electrode PE may include a first pad electrode PE and a second pad electrode PE.

At least one first pad electrode PE may be located in the first pad area PA1, while at least one second pad electrode PE may be located in the second pad area PA2. Each of the first pad electrode PE and the second pad electrode PE may include a plurality of the third protrusions PE_PT and the plurality of the third grooves PE_GR.

The plurality of first grooves LSUB_GR, the plurality of first protrusions LSUB_PT, the plurality of second grooves SUB_GR, and the plurality of second protrusions SUB_PT may be located in each of the first pad area PA1 and the second pad area PA2. The plurality of first grooves LSUB_GR, the plurality of first protrusions LSUB_PT, the plurality of second grooves SUB_GR, the plurality of second protrusions SUB_PT may overlap with the plurality of the third protrusions PE_PT or the plurality of the third grooves PE_GR in the third direction Z, respectively.

In FIG. 13, the plurality of first groove LSUB_GR, the plurality of first protrusions LSUB_PT, the plurality of second grooves SUB_GR, the plurality of second protrusions SUB_PT, the plurality of the third protrusions PE_PT and the plurality of the third grooves PE_GR are located only in each of the first pad area PA1 and the second pad area PA2. However, embodiments according to the present disclosure are not limited thereto. The plurality of first grooves LSUB_GR, the plurality of first protrusions LSUB_PT, the plurality of second grooves SUB_GR, and the plurality of second protrusions SUB_PT may be further located in the remaining area of the auxiliary area SA except for the first pad area PA1 or the second pad area PA2.

The connection circuit board FB may overlap with the first pad area PA1 in the third direction Z. In the first pad area PA1, the lead electrode LE of the connection circuit board FB may overlap with the pad electrode PE in the third direction Z, and may be electrically connected thereto via the plurality of the third protrusions PE_PT.

As shown in FIG. 13, the first pad area PA1 has a structure substantially the same as or similar to the pad area PA of FIGS. 1 to 5. Thus, hereinafter, some redundant descriptions may be omitted.

The driver member DDM may be mounted in the second pad area PA2.

The driver member DDM may include a driver chip IC and a plurality of bump BPs connected to the driver chip IC.

Referring to FIGS. 13 and 14, the plurality of bumps BP may be arranged to overlap the plurality of pad electrodes PE in the third direction Z, respectively. The third protrusion PE_PT of the pad electrode PE may directly contact the bump BP so that the pad electrode PE and the bump BP are electrically connected to each other. In the second pad area PA2, the first groove LSUB_GR, the first protrusion LSUB_PT, the second groove SUB_GR, and the second protrusion SUB_PT may be arranged to overlap with the third protrusion PE_PT or the third groove PE_GR in the third direction Z.

As shown in FIG. 13 and FIG. 14, the second pad area PA2 has substantially the same or similar structure as that of the first pad area PA1, except that the third protrusion PE_PT contacts not the lead electrode LE but the bump BP. Thus, hereinafter, some duplicate descriptions therebetween may be omitted.

In a similar manner to the implementations of FIGS. 5 to 10, in a plan view, the plurality of first grooves LSUB_GR may be randomly or regularly arranged within the first pad area PA1 and the second pad area PA2. However, embodiments according to the present disclosure are not limited thereto. The plurality of first grooves LSUB_GR may be randomly or regularly arranged across an entire auxiliary area SA. Furthermore, as described above in FIG. 5 to FIG. 10, a planar size or a vertical dimension of each of the first groove LSUB_GR, the first protrusion LSUB_PT, the second groove SUB_GR, the second protrusion SUB_PT, the third groove PE_GR, and the third protrusion PE_PT may vary.

The connection circuit board FB may be attached to the first pad area PA1 via a first adhesive member AD1. The driver member DDM may be attached to the second pad area PA2 via a second adhesive member AD2.

Each of the first adhesive member AD1 and the second adhesive member AD2 may include an insulating adhesive material. According to some embodiments, the insulating adhesive material may include a thermoplastic material such as styrene butadiene and polyvinyl butene. However, embodiments according to the present disclosure are not limited thereto. According to some embodiments, the insulating adhesive material may include a thermosetting material such as epoxy resin, polyurethane, acrylic resin, etc. However, embodiments according to the present disclosure are not limited thereto. Each of the first adhesive member AD1 and the second adhesive member AD2 may not contain an electrically-conductive particle or an electrically-conductive material. In this implementation, each of the first adhesive member AD1 and the second adhesive member AD2 may be embodied as a non-electrically-conductive film, or a non-electrically-conductive adhesive. However, embodiments according to the present disclosure are not limited thereto.

The implementation of FIG. 12 and FIG. 13 is substantially the same or similar to the implementation of FIG. 1 to FIG. 5, except that the driver member DDM is mounted on the display panel DP. Thus, hereinafter, some duplicate descriptions therebetween may be omitted.

Figure 15:
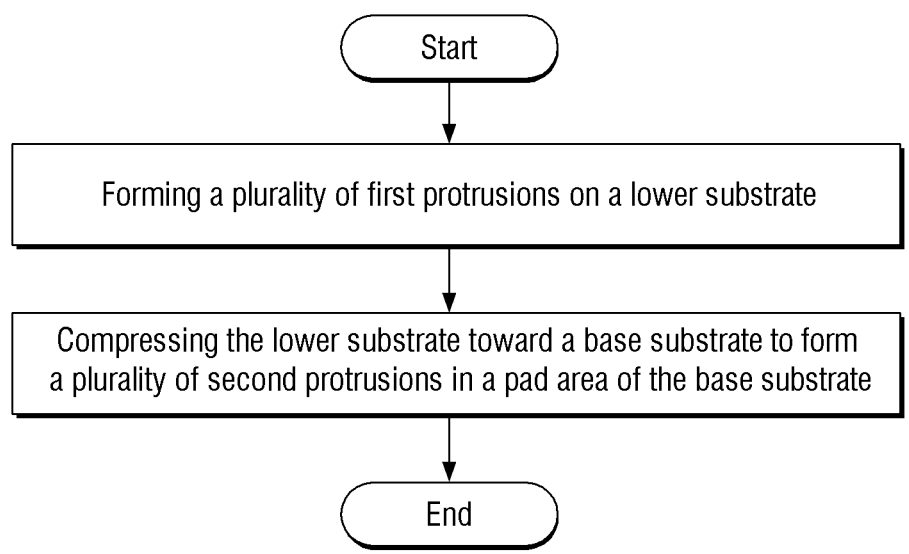
FIG. 15 is a flow chart of a method for manufacturing a display device according to some embodiments.
Figure 16:
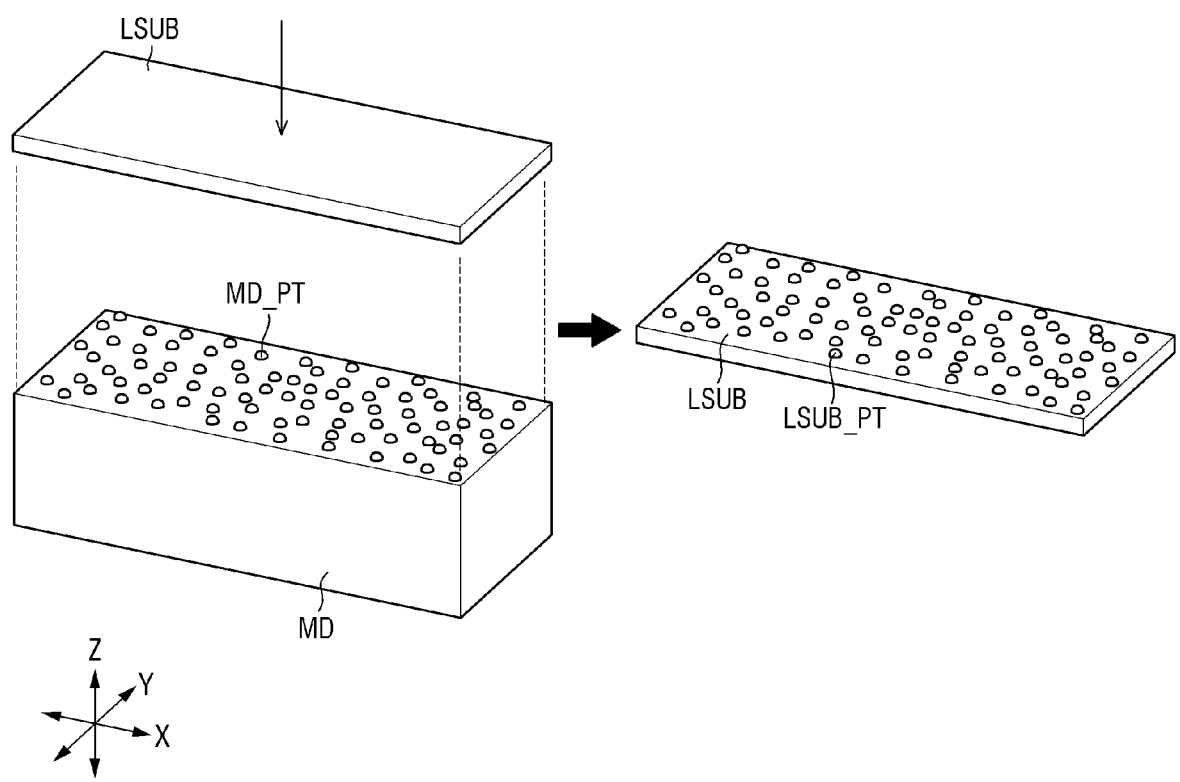
FIG. 16 to FIG. 18 are diagrams showing steps of a method for manufacturing the display device according to some embodiments.
Figure 17:
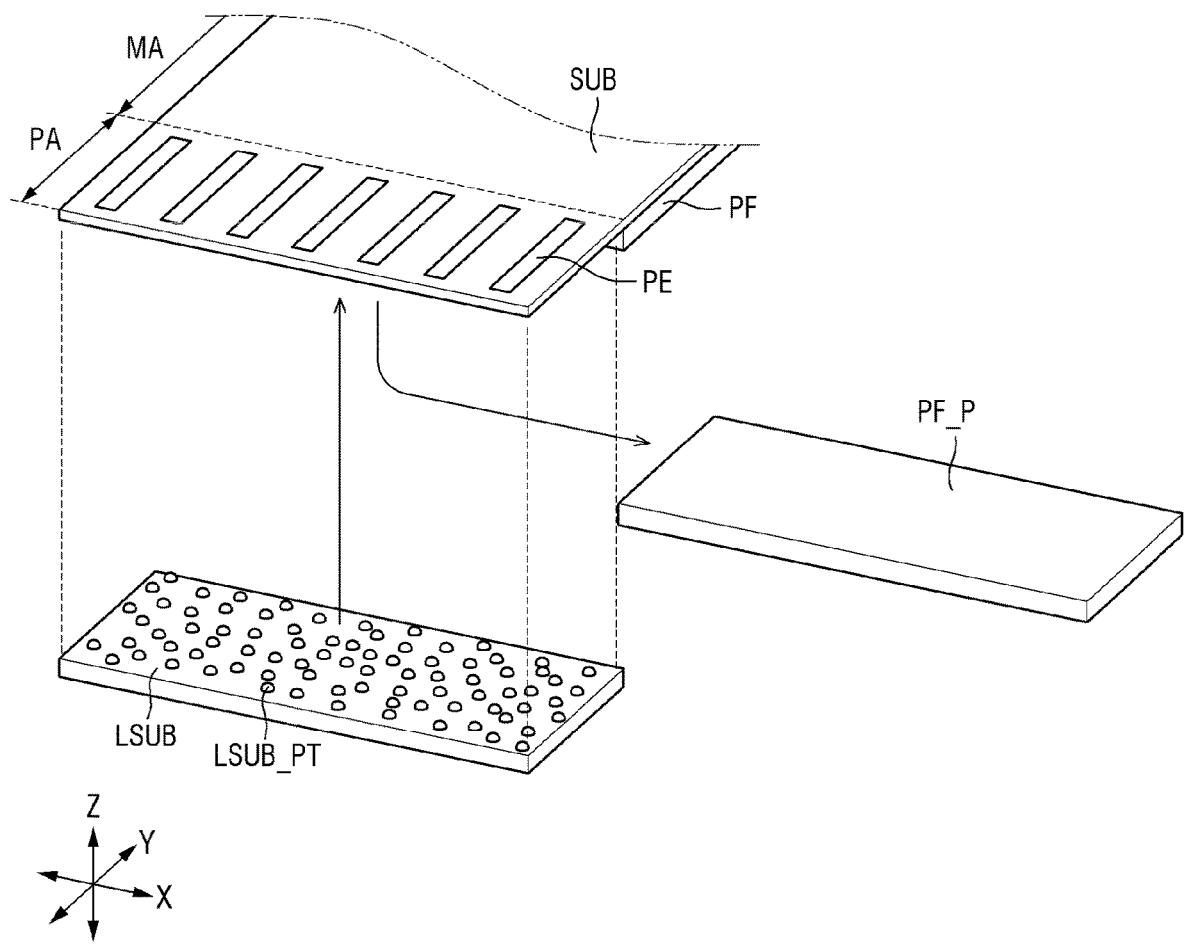
Figure 18:
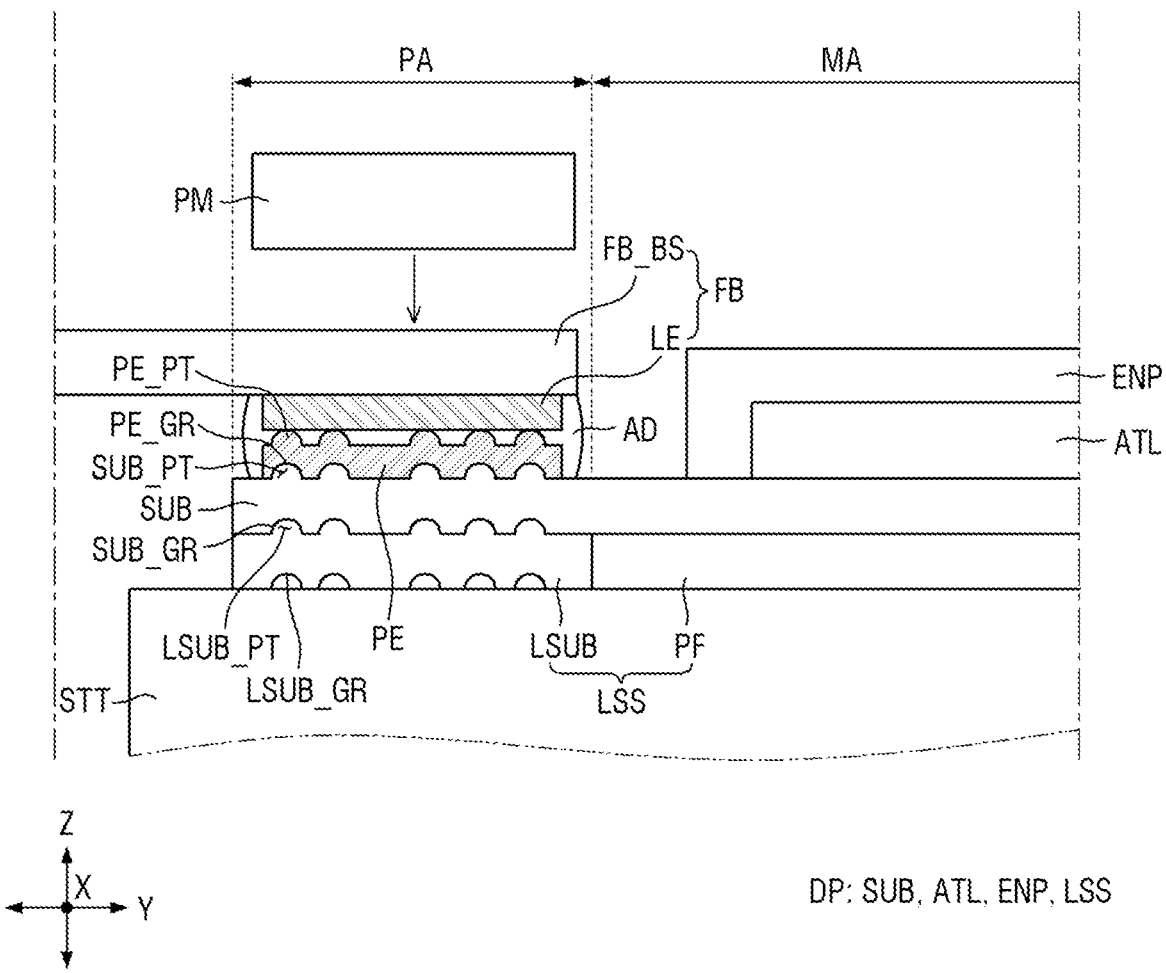

FIG. 15 is a flow chart of a method for manufacturing a display device according to an implementation. FIG. 16 to FIG. 18 are diagrams showing steps of a method for manufacturing a display device according to some embodiments.

Referring to FIG. 15 to FIG. 18, a method for manufacturing the display device according to an implementation includes forming the plurality of first protrusions LSUB_PT on the lower substrate LSUB; and compressing the lower substrate LSUB against the base substrate SUB to form the plurality of second protrusions SUB_PTs in the pad area PA of the base substrate SUB.

However, the method for manufacturing the display device is not limited to the example. At least some of steps may be omitted or modified. One or more other steps may be further included in the method with reference to other descriptions herein.

Referring to FIG. 16, the lower substrate LSUB may be prepared. The lower substrate LSUB may be in a state before the plurality of first protrusions LSUB_PTs are formed thereon and thus may have a flat top face and a flat bottom face. The lower substrate LSUB may be made of a material having a greater hardness than that of the base substrate SUB. In one example, the lower substrate LSUB may be embodied as a metal plate including aluminum. However, embodiments according to the present disclosure are not limited thereto.

After the lower substrate LSUB has been prepared, the lower substrate LSUB may be aligned with a mold MD. The lower substrate LSUB may be pressed against one face of the mold MD on which a plurality of protrusion MD_PT are formed. The mold MD has a hardness greater than that of the lower substrate LSUB. Thus, when the lower substrate LSUB is pressed against the mold so as to be in close contact with one face of the mold MD, the plurality of first protrusions LSUB_PT may be formed on a top face of the lower substrate LSUB in a corresponding manner to the plurality of protrusion MD_PT of the mold MD. Further, as shown in FIG. 18, the plurality of first grooves LSUB_GR respectively overlapping the plurality of first protrusions LSUB_PT in the third direction Z may be formed in a bottom face of the lower substrate LSUB.

Referring to FIG. 17, after the plurality of first protrusions LSUB_PT are formed, a portion PF_P of the polymer film layer PF located on a bottom face of the base substrate SUB so as to overlap with the pad area PA of the base substrate SUB may be removed. A bottom face of the base substrate SUB located in the pad area PA may be exposed to an outside. The removal of the polymer film layer PF may be performed before the formation of the plurality of first protrusions LSUB_PT.

After the portion PF_P of the polymer film layer PF has been removed, the lower substrate LSUB and the pad area PA of the base substrate SUB may be aligned with each other in the third direction Z. Thereafter, the lower substrate LSUB may be attached on the bottom face of the pad area PA of the base substrate SUB.

Referring to FIG. 18, after the lower substrate LSUB has been attached to the base substrate SUB, the display panel DP may be mounted on a stage STT. Subsequently, the lead electrode LE of the connection circuit board FB and the pad electrode PE of the display panel DP may be aligned with each other in the third direction Z. The adhesive member AD may be interposed between the connection circuit board FB and the display panel DP. As described above, the adhesive member AD may not contain conductive particles.

After the alignment between the lead electrode LE and the pad electrode PE, a compressing process of compressing the connection circuit board FB and the display panel DP using a pressing member PM may be performed. The compression process may include a thermocompression process. The pressing member PM may be cured via a thermocompression process, so that the connection circuit board FB may be attached to the base substrate SUB.

When compressing the pressing member PM, a pattern of the plurality of first protrusions LSUB_PT may be transferred such that the plurality of second grooves SUB_GR may be formed in a bottom face of the base substrate SUB in a corresponding manner to the plurality of first protrusions LSUB_PT, and thus the plurality of second protrusions SUB_PT may be formed on a top face of the base substrate SUB, and thus the plurality of the third grooves PE_GR may be formed on a bottom face of the pad electrode PE, and thus the plurality of the third protrusion PE_PT may be formed on a top face of the pad electrode PE. At this time, the plurality of second grooves SUB_GR, the plurality of second protrusions SUB_PT, the plurality of the third grooves PE_GR, and the plurality of the third protrusions PE_PT may be formed substantially simultaneously.

When pressing the pressing member PM, the connection circuit board FB may be in close contact with the base substrate SUB, such that the plurality of the third protrusions PE_PT may be in contact with the bottom face of the lead electrode LE. Accordingly, the pad electrode PE and the lead electrode LE may be electrically connected to each other.

Referring further to FIG. 11, in some implementations, after the compression process is completed, the lower substrate LSUB may be removed from the base substrate SUB, and then another lower substrate LSUB made of substantially the same or similar material as or to that of the polymer film layer PF may be attached to the pad area PA. In this case, as shown in FIG. 11, another lower substrate LSUB may have a flat top face and a flat bottom face.

Referring further to FIG. 12 to FIG. 14, in some implementations, when the driver member DDM is mounted on the display panel DP, the driver member DDM may be attached to the second pad area PA2 in a manner substantially the same as or similar to a manner in which the connection circuit board FB is attached thereto. In one example, the driver member DDM may be thermocompressed to the base substrate SUB using a member substantially the same as or similar to the pressing member PM. In this case, the third protrusions PE_PT formed on a top face of the pad electrode PE in a corresponding manner to the first protrusions LSUB_PT may be in contact with the bump BP, so that the pad electrode PE and the bump BP may be electrically connected to each other.

Although embodiments of the invention have been disclosed for illustrative purposes, those skilled in the art will appreciate that various modifications, additions and substitutions are possible, without departing from the scope and spirit of embodiments according to the present invention as disclosed in the accompanying claims, and their equivalents.

What is claimed is:

1. A display device comprising:
a lower substrate including a plurality of first protrusions;
a base substrate on the lower substrate, wherein the base substrate includes a plurality of second protrusions overlapping with the plurality of first protrusions, respectively; and
a plurality of pad electrodes on the base substrate, wherein each of the plurality of pad electrodes includes a plurality of third protrusions overlapping with the plurality of second protrusions, respectively.

2. The display device of claim 1, wherein the display device further comprises a connection circuit board including a plurality of lead electrodes respectively facing toward the plurality of pad electrodes, wherein the plurality of the third protrusions are in contact with each of the plurality of lead electrodes.

3. The display device of claim 2, wherein the display device further comprises an adhesive member between the base substrate and the connection circuit board, wherein the adhesive member comprises an insulating adhesive material.

4. The display device of claim 3, wherein the adhesive member is free of an electrically-conductive particle.

5. The display device of claim 1, wherein the lower substrate includes a plurality of first grooves respectively overlapping with the plurality of first protrusions and recessed toward the plurality of first protrusions, wherein the base substrate includes a plurality of second grooves respectively overlapping with the plurality of second protrusions and recessed toward the plurality of second protrusions, wherein each pad electrode includes a plurality of third grooves respectively overlapping with the plurality of the third protrusions and recessed toward the plurality of the third protrusions.

6. The display device of claim 5, wherein the plurality of first protrusions are respectively accommodated in the plurality of second grooves, wherein the plurality of second protrusions are respectively accommodated in the plurality of the third grooves.

7. The display device of claim 1, wherein the plurality of first protrusions are only within a footprint of corresponding ones of the plurality of pad electrodes in a plan view.

8. The display device of claim 1, wherein the plurality of first protrusions include an overlapping protrusion within a boundary of each pad electrode, and an alignment protrusion outside the boundary of each pad electrode in a plan view.

9. The display device of claim 8, wherein the alignment protrusion is between adjacent ones of the plurality of pad electrodes in a plan view.

10. The display device of claim 1, wherein each first protrusion, each second protrusion and each third protrusion are aligned with each other in a thickness direction of the display device.

11. The display device of claim 1, wherein the display device further comprises a driver member including a plurality of bumps respectively facing toward the plurality of pad electrodes, wherein the plurality of the third protrusions is in contact with each of the plurality of bumps.

12. A display device comprising:
a base substrate;
an active element layer on one face of the base substrate;
a plurality of pad electrodes on one face of the base substrate;
a polymer film layer on an opposite face to one face of the base substrate, wherein the polymer film layer overlaps the active element layer in a thickness direction of the display device; and
a lower substrate on the opposite face of the base substrate, wherein the lower substrate overlaps with the plurality of pad electrodes in the thickness direction of the display device, wherein each of the lower substrate, the base substrate, and each of the plurality of pad electrodes includes a plurality of protrusions.

13. The display device of claim 12, wherein the plurality of protrusions of the lower substrate, the plurality of protrusions of the base substrate, and the plurality of protrusions of the pad electrodes are respectively aligned with each other in the thickness direction of the display device.

14. The display device of claim 12, wherein the display device further comprises:
a connection circuit board including a plurality of lead electrodes respectively facing toward the plurality of pad electrodes; and
an adhesive member between the connection circuit board and the base substrate,
wherein the plurality of protrusions of each of the plurality of pad electrodes are in contact with each of the plurality of lead electrodes.

15. The display device of claim 14, wherein the adhesive member is free of an electrically-conductive particle.

16. The display device of claim 12, wherein the plurality of protrusions of the lower substrate are only within a footprint of corresponding ones of the plurality of pad electrodes in a plan view.

17. The display device of claim 12, wherein the plurality of protrusions of the lower substrate include an overlapping protrusion within a boundary of each pad electrode and an alignment protrusion outside the boundary of each pad electrode in a plan view.

18. A method for manufacturing a display device, the method comprising:
forming a plurality of first protrusions on a lower substrate; and
compressing the lower substrate against a base substrate to form a plurality of second protrusions in a pad area of the base substrate.

19. The method of claim 18, wherein forming the plurality of first protrusions on the lower substrate includes compressing the lower substrate against one face of a mold on which a plurality of protrusions are formed.

20. The method of claim 19, wherein the method further comprises, before compressing the lower substrate, removing a portion of a polymer film layer in the pad area of the base substrate.

* * * * *